United States Patent
Nakahira et al.

(10) Patent No.: US 9,460,889 B2
(45) Date of Patent: Oct. 4, 2016

(54) CHARGED PARTICLE MICROSCOPE DEVICE AND IMAGE CAPTURING METHOD

(75) Inventors: Kenji Nakahira, Tokyo (JP); Atsushi Miyamoto, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 389 days.

(21) Appl. No.: 14/110,758

(22) PCT Filed: Apr. 11, 2012

(86) PCT No.: PCT/JP2012/002498
§ 371 (c)(1),
(2), (4) Date: Dec. 11, 2013

(87) PCT Pub. No.: WO2012/140874
PCT Pub. Date: Oct. 18, 2012

(65) Prior Publication Data
US 2014/0092231 A1    Apr. 3, 2014

(30) Foreign Application Priority Data
Apr. 15, 2011  (JP) .................................. 2011-090628

(51) Int. Cl.
*H01J 37/00* (2006.01)
*H01J 37/26* (2006.01)
(Continued)

(52) U.S. Cl.
CPC .............. *H01J 37/26* (2013.01); *H01J 37/244* (2013.01); *H01J 37/28* (2013.01); *H01J 2237/221* (2013.01); *H01J 2237/24495* (2013.01); *H01J 2237/2809* (2013.01)

(58) Field of Classification Search
CPC ......... C23C 8/06; C23C 16/047; G03F 1/74; H01J 37/304; H01J 37/3056; H01J 2237/31744; H01J 2237/30466; H01J 2237/30483; H01J 2237/31732; H01J 2237/24495; H01J 37/26; H01J 37/244; H01J 37/28; H01J 2237/2809; H01J 2237/221
See application file for complete search history.

(56) References Cited

U.S. PATENT DOCUMENTS 4,500,790 A * 2/1985 Bretscher .............. H01J 37/304
250/397
4,686,531 A * 8/1987 Shambroom .......... G01B 7/082
324/611
(Continued)

FOREIGN PATENT DOCUMENTS

JP    08-227679 A    9/1996
JP    11-355787 A    12/1999
(Continued)

OTHER PUBLICATIONS

Japanese Office Action, along with a partial English language translation, received in Japanese Application No. 2011-090628 dated Jan. 21, 2014.

*Primary Examiner* — Jay Patel
*Assistant Examiner* — Frank Huang
(74) *Attorney, Agent, or Firm* — Mattingly & Malur, PC

(57) ABSTRACT

A specimen image capture method using a charged particle microscope device includes: a first image acquisition step in which the gain of a detector in a charged particle microscope is set to a first gain value, charged particle beam scanning is carried out on a specimen, and a first image is obtained; a second image acquisition step in which the gain of the detector is set to a second gain value, which is different to the first gain value, charged particle beam scanning is carried out on the specimen, and a second image is obtained; and an image combination step in which the first gain value and the second gain value are used and the first image and the second image are combined.

8 Claims, 22 Drawing Sheets

(51) Int. Cl.
*H01J 37/244* (2006.01)
*H01J 37/28* (2006.01)

(56) References Cited

U.S. PATENT DOCUMENTS

| | | | | |
|---|---|---|---|---|
| 6,028,608 | A * | 2/2000 | Jenkins | G06T 1/0021 345/619 |
| 6,608,305 | B1 * | 8/2003 | Kin | H01J 37/222 250/306 |
| 8,179,432 | B2 * | 5/2012 | Yazdanfar | G02B 21/244 250/201.2 |
| 8,237,119 | B2 | 8/2012 | Nakahira et al. | |
| 8,310,531 | B2 * | 11/2012 | Nandy | G01N 21/6458 348/226.1 |
| 2004/0196365 | A1 * | 10/2004 | Green | 348/79 |
| 2006/0045505 | A1 * | 3/2006 | Zeineh | G02B 21/365 396/89 |
| 2007/0278180 | A1 * | 12/2007 | Williamson | G01N 1/32 216/58 |
| 2008/0059889 | A1 * | 3/2008 | Parker | G06F 17/30241 715/748 |
| 2008/0247670 | A1 * | 10/2008 | Tam | G06T 7/0051 382/298 |
| 2008/0284869 | A1 * | 11/2008 | Utsugi | G06T 7/408 348/222.1 |
| 2009/0231362 | A1 * | 9/2009 | Kaba | G11B 27/034 345/660 |
| 2010/0080448 | A1 * | 4/2010 | Tam | G06T 7/0051 382/154 |
| 2010/0297362 | A1 * | 11/2010 | Budach | C23C 16/047 427/585 |
| 2010/0331684 | A1 * | 12/2010 | Ragauskas | A61B 5/031 600/438 |
| 2011/0285813 | A1 * | 11/2011 | Girdzijauskas | H04N 13/0011 348/42 |

FOREIGN PATENT DOCUMENTS

| | | |
|---|---|---|
| JP | 2000-131045 A | 5/2000 |
| JP | 2001-202914 A | 7/2001 |
| JP | 2004-208044 A | 7/2004 |
| JP | 2007-220615 A | 8/2007 |
| JP | 2009-245674 A | 10/2009 |
| JP | 2011-119446 A | 6/2011 |

* cited by examiner

CHARGED-PARTICLE IMAGE
CAPTURING DEVICE

FIG. 4
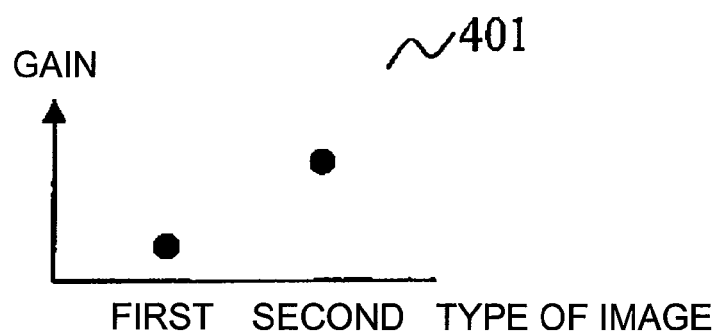
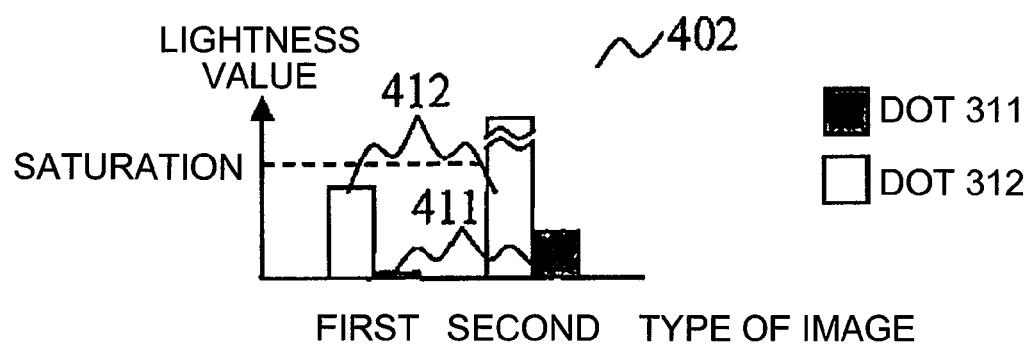
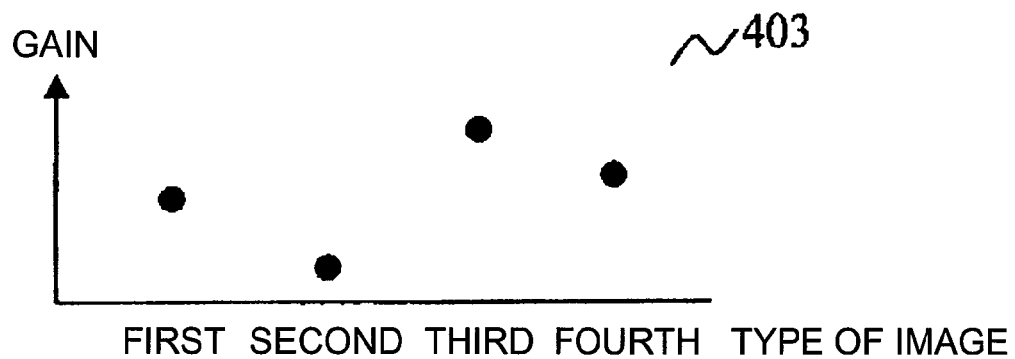

FIG. 5
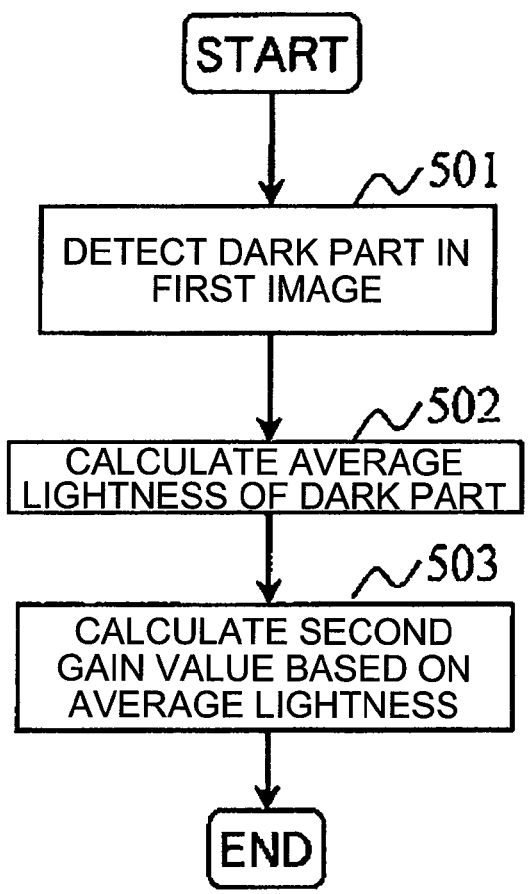
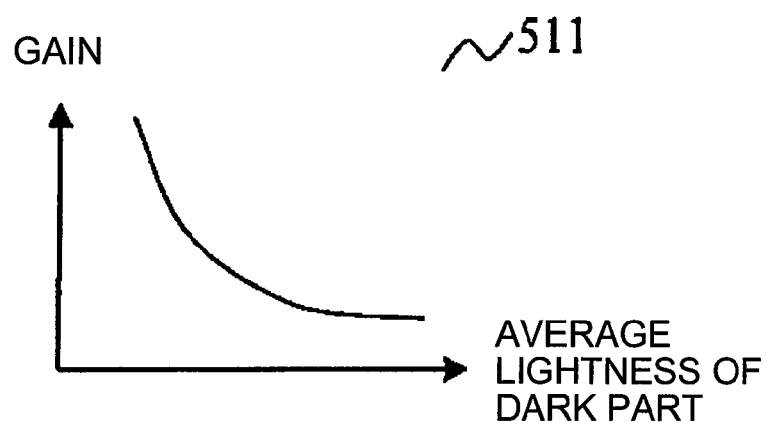

FIG. 6
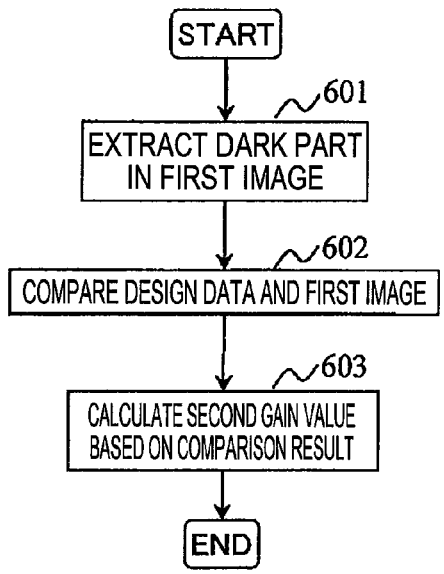
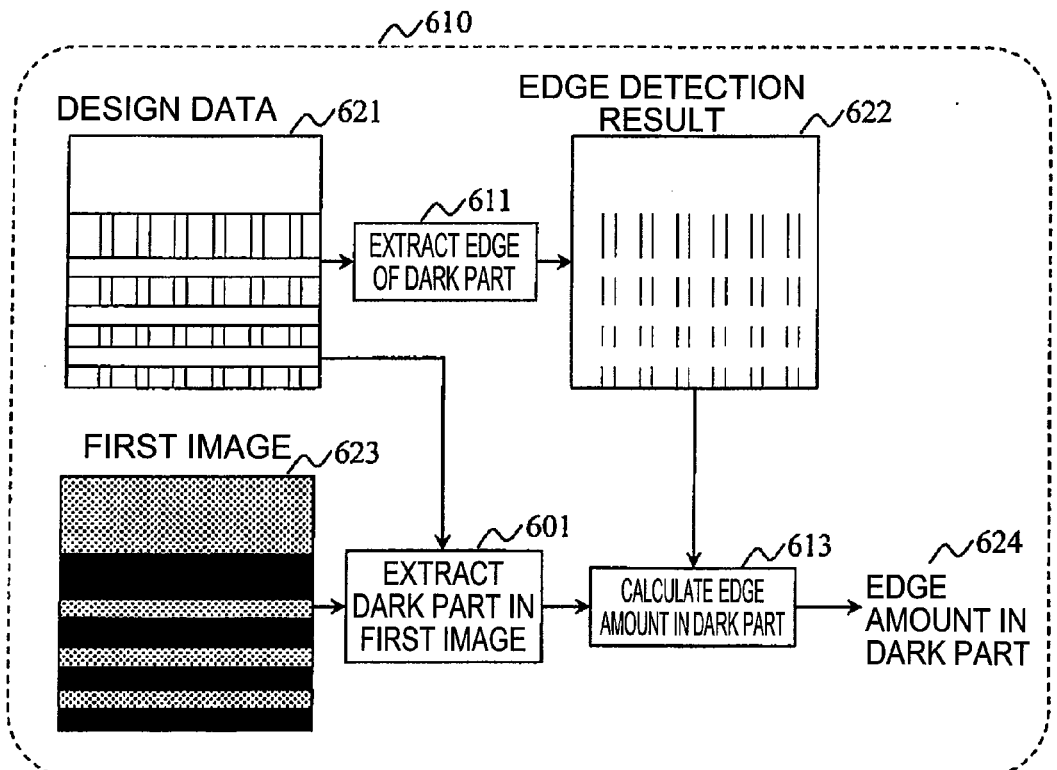

FIG. 7
A
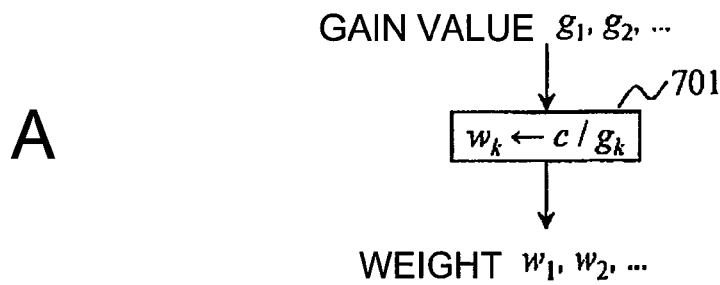
B
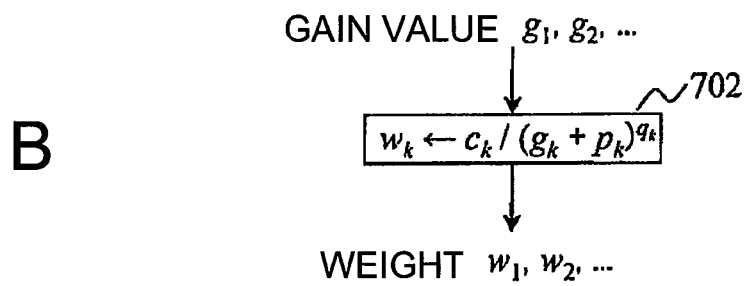
C
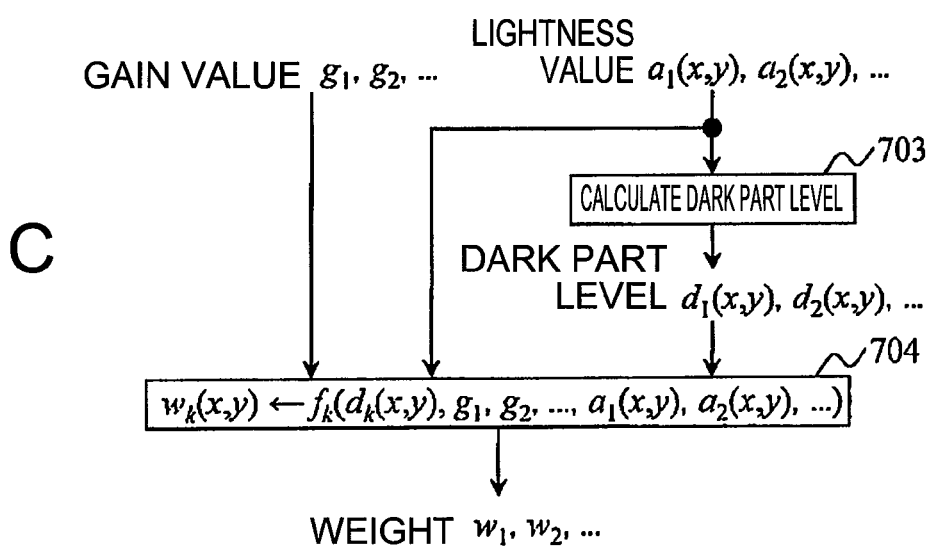

FIG. 8
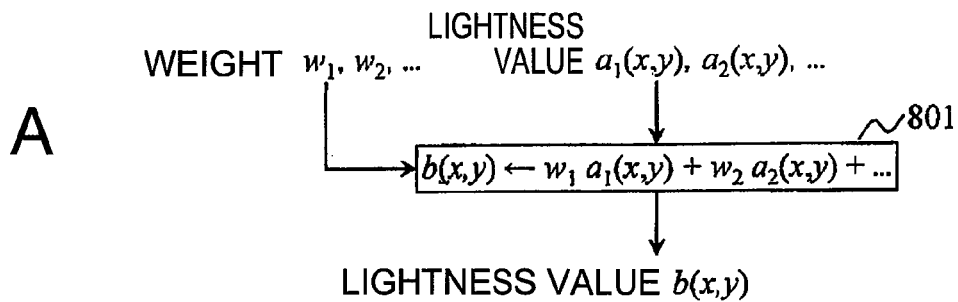
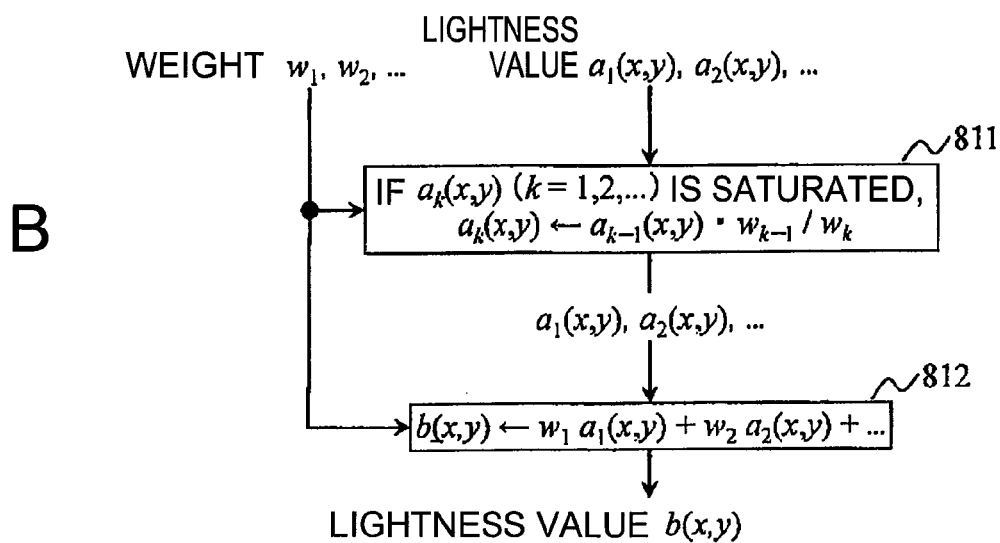
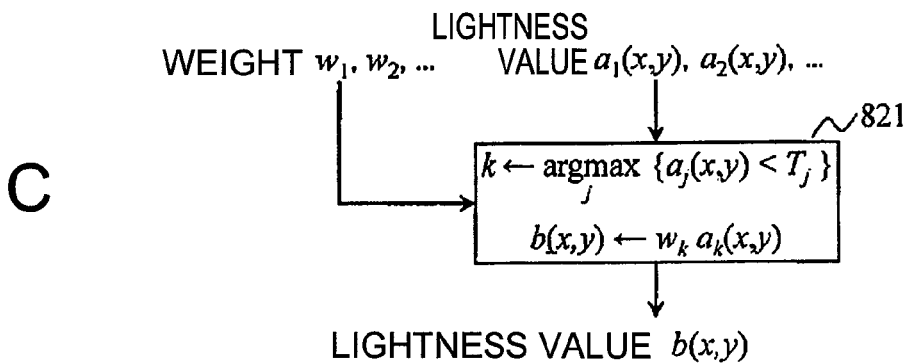

GAIN VALUE $g_1, g_2, \ldots$
PROBE CURRENT $I_1, I_2, \ldots$
BEAM IRRADIATION TIME $T_1, T_2, \ldots$
SAMPLE CHARGING LEVEL $S_1, S_2, \ldots$ $w_k \leftarrow c_k F_k(I_k, T_k, S_k) / g_k$ ~1301

WEIGHT $w_1, w_2, \ldots$

FIG. 16

```
                                                    1601
┌─────────────────────────────────────────────────┐
│ DATE AND TIME            xxx YEAR xx MONTH xx DAY│
│ ACCELERATION VOLTAGE     1000V                   │
│ PROBE CURRENT            100pA                   │
│       ⋮                         1602             │
│ FIRST GAIN VALUE         1.0                     │
│ SECOND GAIN VALUE        23.5   1603             │
│ FIRST WEIGHT             1.00                    │
│ SECOND WEIGHT            0.12                    │
│       ⋮                         1604             │
│ SECOND PROBE CURRENT     150pA                   │
│       ⋮                         1605             │
│ SATURATION AREA OF SECOND IMAGE  125             │
│ DARK PART LEVEL          xx,xx,xx,...            │
│       ⋮                                          │
└─────────────────────────────────────────────────┘
```

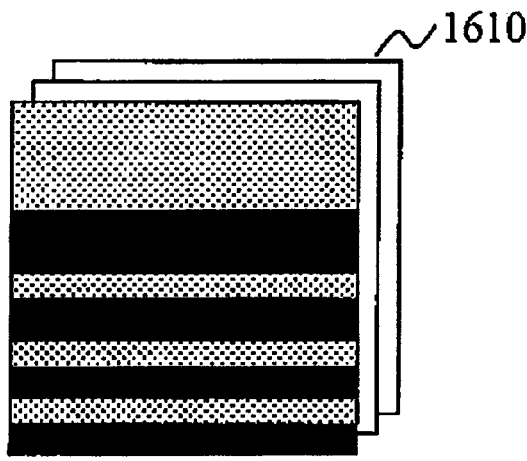

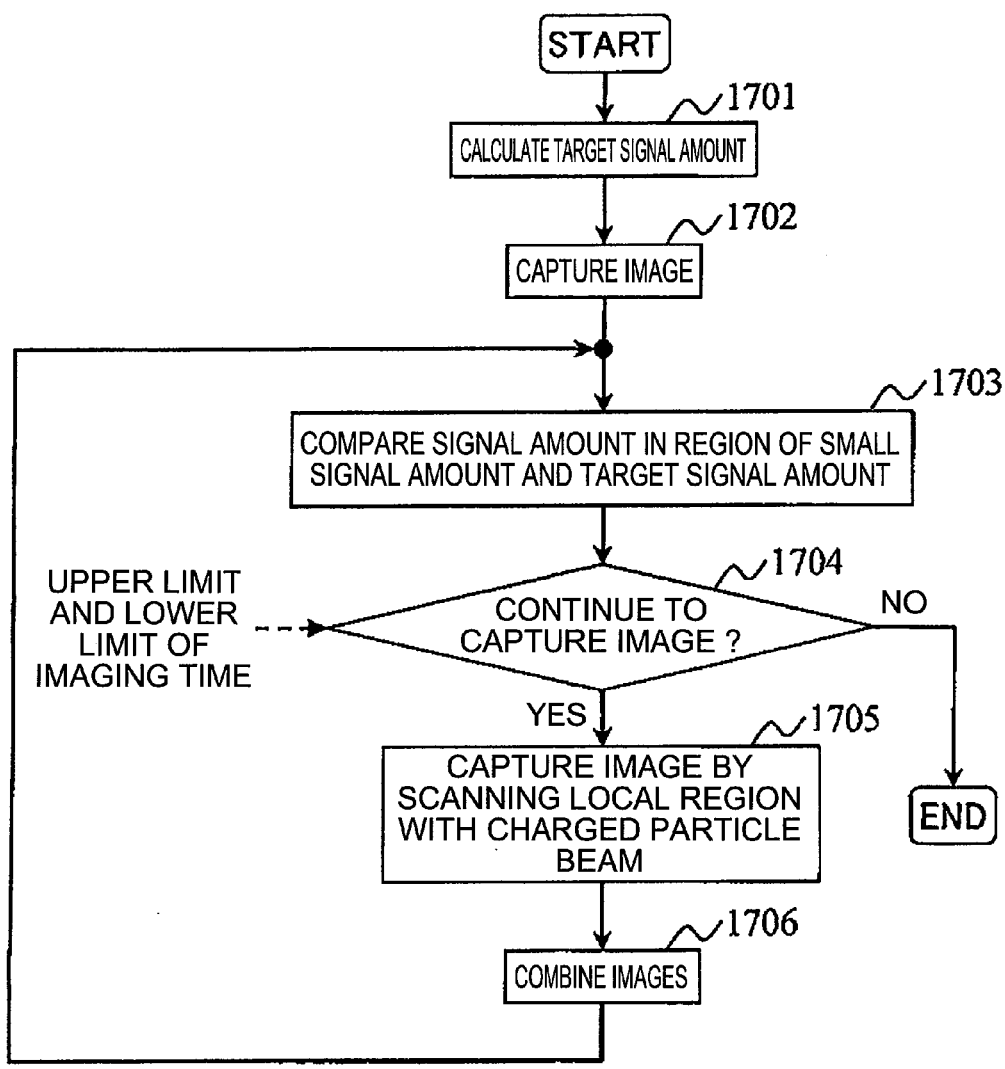

FIG. 20
A
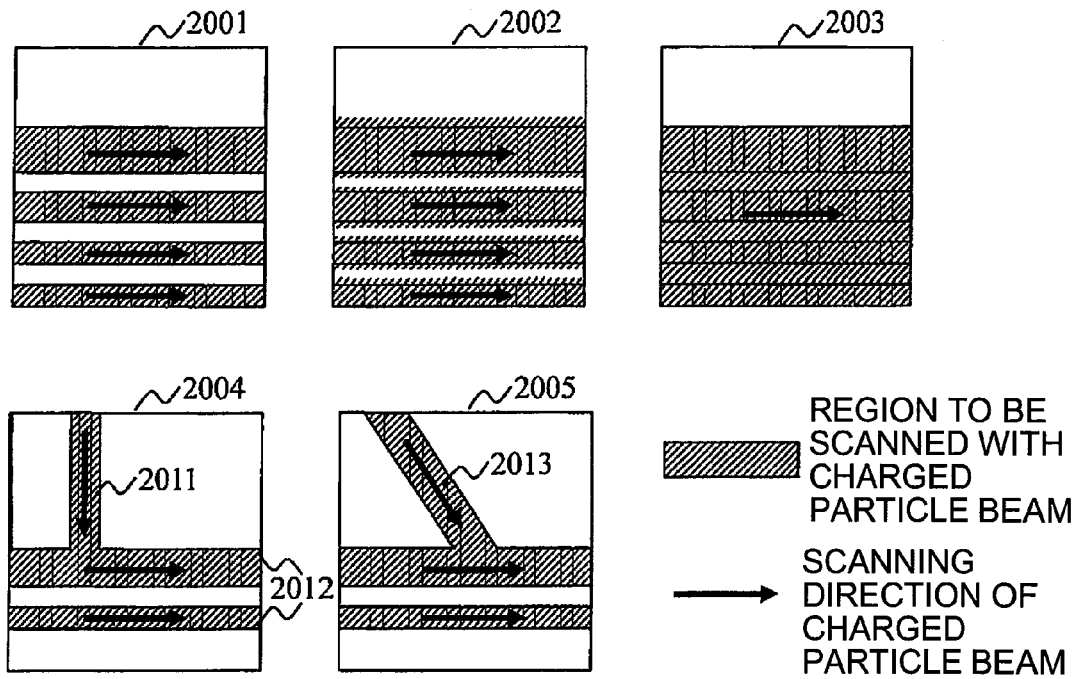
B
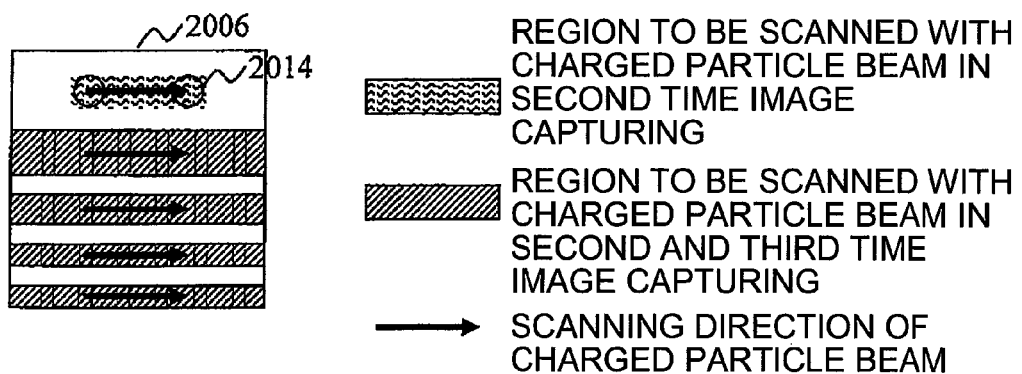

FIG. 22
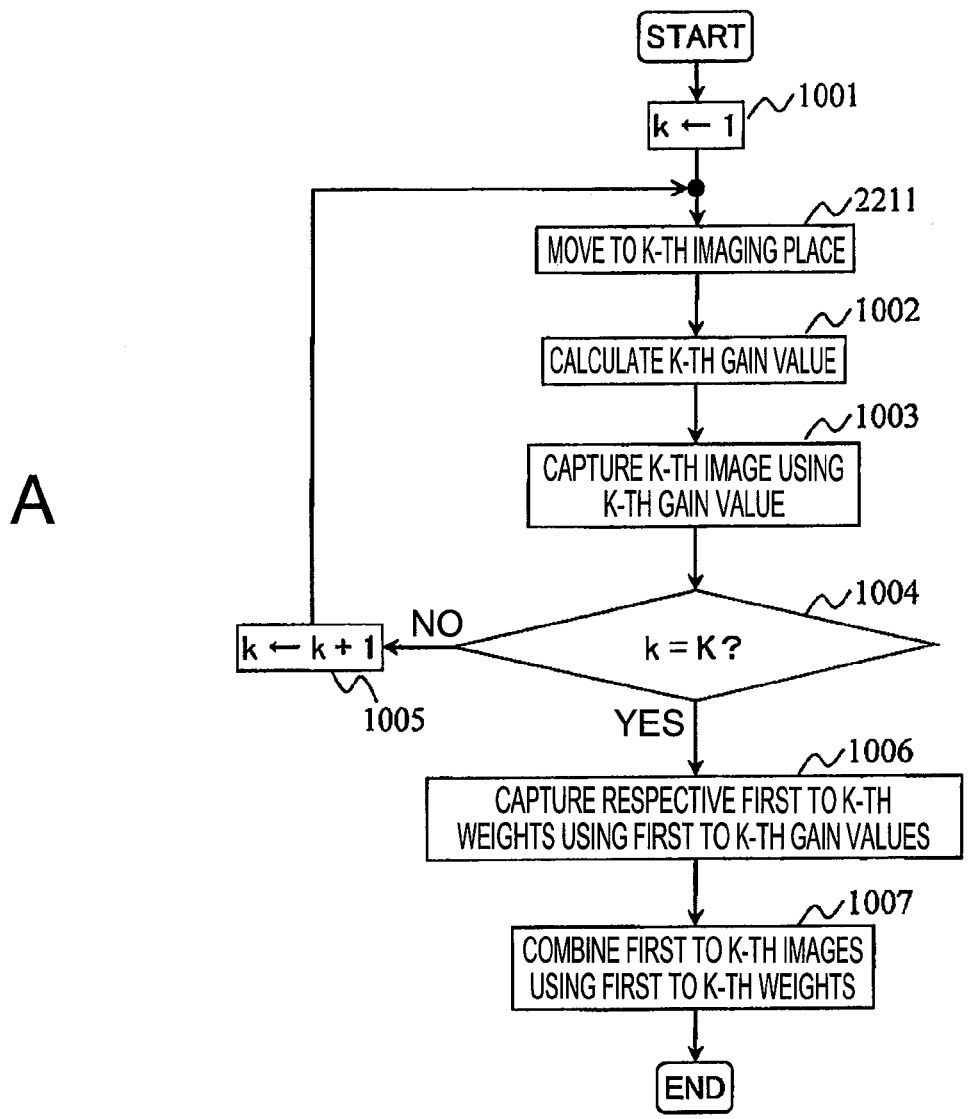
A
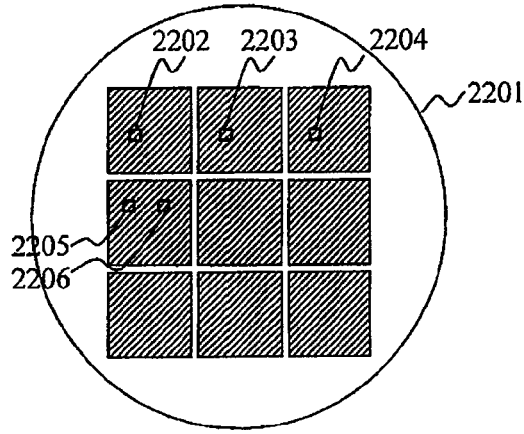
B

CHARGED PARTICLE MICROSCOPE DEVICE AND IMAGE CAPTURING METHOD

TECHNICAL FIELD

The present invention relates to charged particle microscope devices for capturing an image by irradiating a sample with a charged particle, and in particular relates to a charged particle microscope device and an image capturing method for capturing a high quality image.

BACKGROUND ART

A charged particle microscope has a very high resolution as compared with an optical microscope, and is widely used in order to clearly observe a fine structure of an object to be observed. In a charged particle microscope, a target sample is irradiated with a charged particle beam, and a particle (a charged particle of the same type as or a different type from the emitted charged particle applied to the target sample, or electromagnetic wave, a photon) that is emitted from the target sample or transmits through the target sample are detected by a detector, thereby capturing an enlarged image of the target sample.

In particular, in a semiconductor manufacturing process, charged particle microscopes, such as a scanning electron microscope, a scanning ion microscope, a scanning transmission electron microscope, are used as the applications, such as inspection of a semiconductor wafer, measurement of a pattern size, and measurement of a pattern shape. In these applications, the observation of a semiconductor pattern or a defect, the detection of a defect, the cause analysis of a defect, the measurement of a pattern size, and the like are performed using a captured image.

In the charged particle microscope, a function to provide a high quality image is one of the most important functions. On the other hand, in recent years, as the sizes of semiconductor patterns further decrease and the density of semiconductor patterns further increases, it is becoming difficult to detect a sufficient amount of particles emitted from underlayer regions (regions other than upper layer patterns) in a target sample with a multilayer layer and thus there is a problem that visibility significantly drops, such as that the S/N and/or contrast in an underlayer region decrease. Similarly, also in a hole pattern, it is difficult to detect particles from the bottom of a hole and therefore an excellent image quality cannot be obtained in the bottom region of a hole. A region, such as an underlayer region or a hole pattern, where a sufficient signal amount (a detected amount of particles emitted from a sample) cannot be obtained, is referred to as a dark part. It is also possible to detect more particles emitted from a dark part by improving a charged particle beam, with which a sample is irradiated, and/or an electromagnetic field distribution in a vicinity of a sample, but there is a limit in increasing a signal amount to be obtained. Moreover, there is also a method for achieving an increase in image quality by image processing a captured image (e.g., Patent Literature 1). Moreover, in an optical camera, an optical microscope, and/or the like, there is proposed a method for imaging with a varied exposure amount in order to clearly display a dark part (e.g., Patent Literature 2). An increase of the exposure amount in an optical microscope or an optical camera corresponds to an increase of the irradiation amount (hereinafter, dose amount) of a charged particle beam in a charged particle microscope.

CITATION LIST

Patent Literature

PATENT LITERATURE 1 JP-A-2009-245674
PATENT LITERATURE 2 JP-A-11-355787

SUMMARY OF THE INVENTION

Technical Problem

With the technique proposed in Patent Literature 1 for performing image processing on a captured image, if information regarding a dark part is included to some extent in the captured image, this information can be also emphasized. However, if the number of particles emitted from a dark part is extremely small and the signal amount obtained from a dark part is extremely small, a significant effect due to the image processing cannot be expected.

Moreover, it is difficult to apply, as is, the approach of imaging with a varied exposure amount proposed in Patent Literature 2 and used in an optical microscope or the like to a scanning charged particle microscope. In order to increase the dose amount in a scanning charged particle microscope, the amount of current (hereinafter, probe current) of a charged particle beam or the beam irradiation time needs to be increased. However, if the probe current is increased, there is a problem that an image blurs because the intensity distribution of a charged particle beam in the surface of a sample spreads, while if the beam irradiation time is increased, there is a problem that the imaging time increases in proportion to the beam irradiation time. Moreover, if the dose amount is increased, there are demerits, such as that a sample is damaged and/or a sample is charged.

Furthermore, with the approach of imaging with a varied exposure amount, a shot noise among noises contained in an image can be suppressed, but neither a thermal noise overlapping during detection nor a quantization noise overlapping in the course of digitizing an obtained signal can be suppressed. If the signal amount is small, these noises are relatively un-negligible and thus need to be suppressed as much as possible.

The present invention provides a charged particle microscope device and an image capturing method for capturing a high quality image even in the above-described cases.

Solution to Problem

The following explains briefly the outline of a typical invention among the inventions disclosed in the present application.

(1) According to one aspect of the present invention, the gain of a detector is set to different gain values to capture the respective images corresponding to the different gain values, and the captured images are combined using the gain values. Here, the gain value is a value for determining a lightness value that is an output of the detector, and the lightness value is expressed by a value obtained by multiplying a signal amount by the gain value (or a value further added by a bias). Thus, an image less affected by a thermal noise and/or a quantization noise overlapping after detection can be captured. These noises are overlapped at a certain magnitude relative to a lightness value, and therefore with the same signal amount, the larger the gain value, the less the influence of these noises becomes. On the other hand, because the lightness value, which the detector and the like can handle, has an upper limit, the lightness value will saturate if the gain value is too large. For example, a first gain value is set to a gain value similar to the gain value in a conventional image capturing method, and a second gain value is set to a value larger than the first gain value. As a result, a sufficiently large lightness value can be obtained from the first image in a range where the lightness value will not saturate in regions other than a dark part, and from the second image, less-noisy information can be obtained in a dark part, and therefore by combining both images, an excellent image quality can be obtained in the entire region.

(2) According to another aspect of the present invention, a second gain value is calculated using a first image. Thus, the lightness value of a dark part is calculated using the first image, and based on this result, the second gain value is adjusted, so that the lightness value of the dark part in the second image can be set to an appropriate value and the second image having the dark part more clearly displayed therein can be obtained.

(3) According to another aspect of the present invention, it is determined, for each local region, based on a lightness value, whether or not at least one image of a first image and a second image is excluded from a target of composition. Thus, appropriate combining can be performed even if a lightness value saturates in a region other than a dark part, and an excellent image quality can be obtained in the entire region. If there is at least one gain value by which the lightness value will not saturate in the entire region, an image whose lightness value will not saturate in the entire region during combining images can be generated even if other gain value is set to a large value by which the lightness value saturates in a region other than a dark part. Therefore, the gain value can be set to a large value and thus less-noisy information can be obtained in a dark part.

(4) According to another aspect of the present invention, it is determined, using at least one of design data information in a region to be imaged of a sample or a first image, whether or not a second image is captured and combined. Here, the design data represents data indicative of shape information of a semiconductor pattern to manufacture. In many cases, information regarding the contour of a semiconductor pattern, or a shape predicted by litho-simulation or the like, layer characteristic, and the like are described. Moreover, the design data may include information regarding sample characteristics (material properties, electrical characteristics, and the like). Thus, imaging can be performed so that a second image is captured and combined only when a dark part in a region to be imaged needs to be emphasized. When a dark part needs to be emphasized, an image can be captured so that an excellent image quality can be obtained even in a dark part by an image combining method, while when a dark part does not need to be emphasized (e.g., when there is no dark part in a region to be imaged), an image of excellent image quality can be captured at high speed without capturing a second image.

(5) According to another aspect of the present invention, at least one of a probe current, a beam irradiation time, and a sample charging level is set to a value, which is different from the value in the step of capturing the first image, to capture a second image. Thus, in capturing the first image or the second image, the signal amount obtained from a dark part can be increased. The dose amount can be increased by increasing the probe current and/or the beam irradiation time. Moreover, by adjusting the sample charging level to an appropriate value, more charged particles emitted from a sample can be detected. For example, when a first image is captured, these values are set to values usually used, and when a second image is captured, a condition is set so that the signal amount obtained from a dark part increases. In capturing the second image, because appropriate information may not be obtained in a region other than a dark part, a condition can be used so that the signal amount from a dark part can be obtained as much as possible.

(6) According to another aspect of the present invention, a target signal amount is calculated, an image is captured by scanning with a charged particle beam, the signal amount in a region comprising a pixel having a relatively small signal amount in the captured image is compared with the target signal amount, and it is determined whether or not to continue to capture an image. If it is determined to continue to capture an image, then a sample region to be scanned again is calculated based on the position of a pixel of a relatively small signal amount in the captured image, only this region is scanned again with a charged particle beam to capture a new local image, a newly captured image is combined with a previously captured image, and furthermore the step of capturing a new image and combining images is repeated until it is determined not to continue to capture an image. Thus, the imaging time can be controlled in accordance with a level of the signal amount obtained from a dark part, and both an increase in image quality of a dark part and high speed imaging can be achieved. Moreover, in capturing a new image, instead of irradiating a sample region corresponding to the entire region of an image with a charged particle beam, only a small sample region including a dark part can be irradiated with a charged particle beam and thus the imaging time can be reduced. Furthermore, demerits, such as a damage on a sample and charging of a sample occurring in irradiating the sample with a charged particle beam can be reduced.

(7) According to another aspect of the present invention, the target signal amount is calculated based on a request value of S/N or a request value of the signal amount that is specified prior to capturing an image. Thus, a target signal amount can be calculated taking into consideration S/N or the signal amount which a user requests, and an image having an image quality, with which a user is satisfied, can be captured in a time as short as possible.

(8) According to another aspect of the present invention, in determining whether or not to continue to capture an image, the determination is performed based on an upper limit and an lower limit of the imaging time that is specified prior to capturing an image. Thus, capturing an image, wherein it takes a very long imaging time in order to obtain an image satisfying a target signal amount, or capturing an image, wherein on the contrary it takes a very short imaging time but there is still a sufficient room to obtain an excellent image quality, can be suppressed.

Advantageous Effects of Invention

According to the present invention, a charged particle microscope device and an image capturing method capable of solving the above-described problems and capturing a high quality image can be provided.

BRIEF DESCRIPTION OF DRAWINGS

FIG. 4 is one example view pertaining to a method for setting a gain value.

FIG. 5 is one example view of a sequence of calculating a second gain.

FIG. 6 is one example view of the sequence of calculating the second gain.

FIG. 7 is one example view of a sequence of calculating a weight of a first image and a weight of a second image using a first gain value and a second gain value.

FIG. 8 is one example view of a sequence of combining a first image and a second image.

FIG. 16 is one example view of a log to output during image capturing.

FIG. 17 is one example view of a sequence of scanning a local region with a charged particle beam and capturing an image.

FIG. 20 is one example view of setting a local region for capturing an image by scanning with a charged particle beam.

FIG. 22 is one example view of a sequence of varying gain values for different regions, capturing a plurality of images using the varied gain values, and combining the images.

DESCRIPTION OF EMBODIMENTS

The present invention relates to charged particle microscope devices for capturing an image by irradiating a sample with a charged particle, and in particular provides an image capturing method and a charged particle microscope device for improving the visibility of a local region that is difficult to be clearly imaged with a conventional image capturing method. Hereinafter, examples of an embodiment according to the present invention are described using the accompanying drawings.

Figure 1:
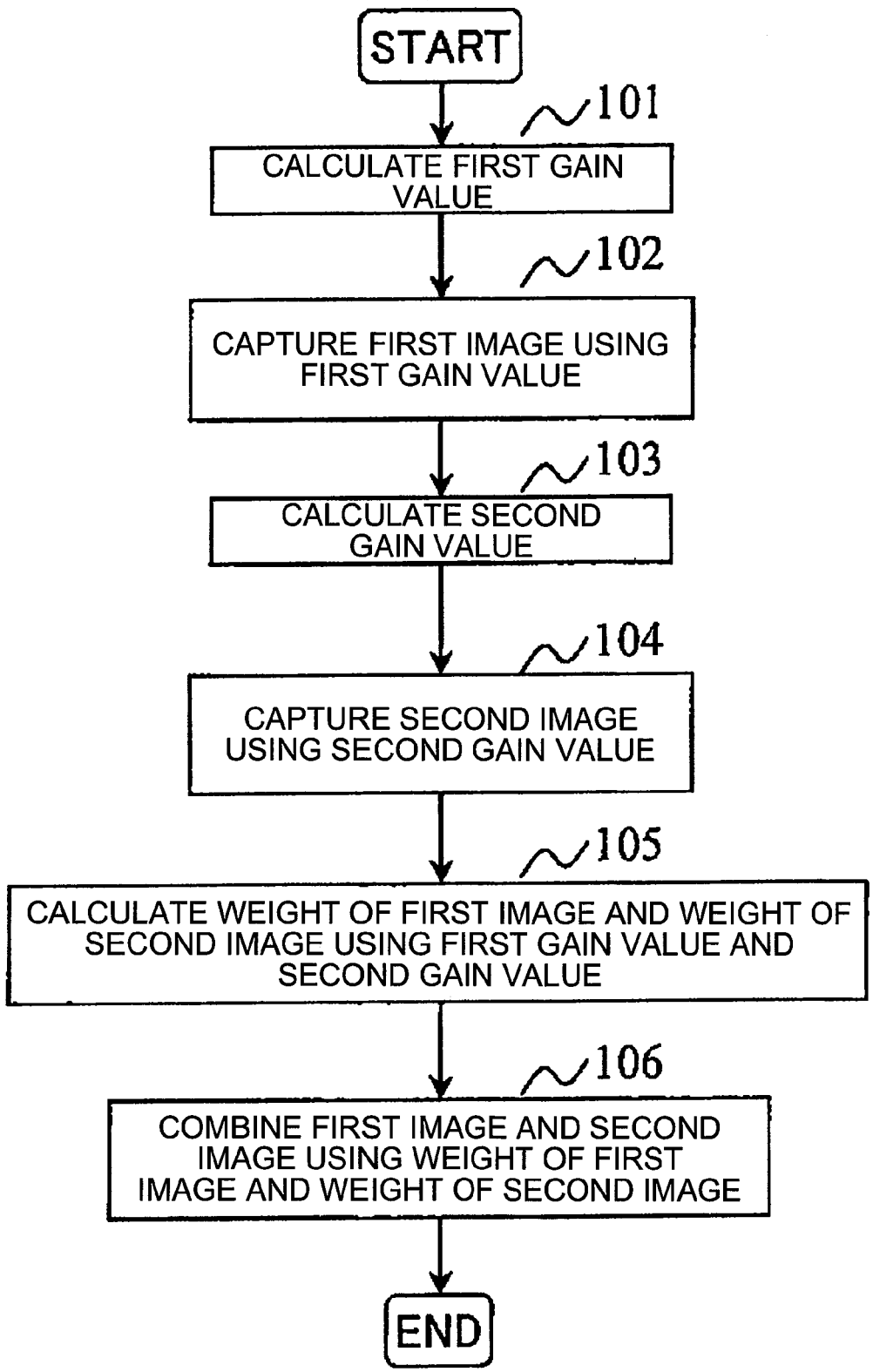
FIG. 1 is an example view of a sequence of varying gain values, capturing a plurality of charged-particle images using the varied gain values, and combining the captured images.

[Description of FIG. 1]

FIG. 1 is an example view of a sequence of varying gain values, capturing a plurality of charged-particle images using the varied gain values, and combining the captured images. First, in Step 101, a first gain value is calculated, and in Step 102 a first image is captured using the first gain value. Next, in Step 103, a second gain value different from the first gain value is calculated, and in Step 104 a second image is captured using the second gain value. Next, in Step 105, using the first gain value and the second gain value, a weight is calculated for each of the captured first image and second image. Finally, in Step 106, the first image and the second image are combined using the calculated weights.

[Effect of FIG. 1]

Thus, an image less affected by a thermal noise and/or a quantization noise overlapping after detection can be captured. These noises are overlapped at a fixed magnitude relative to a lightness value, and therefore with the same signal amount, the larger the gain value, the less the influence of these noises become. On the other hand, because the lightness value, which a detector and the like can handle, has an upper limit, the lightness value will saturate if a gain value is too large. For example, a first gain value is set to a gain value similar to the gain value in a conventional image capturing method, and a second gain value is set to a value larger than the first gain value. As a result, a sufficiently large lightness value can be obtained from a first image in a range where the lightness value will not saturate in regions other than a dark part. From a second image, less-noisy information can be obtained in a dark part, and therefore by combining both images, an excellent image quality can be obtained in the entire region.

[Complement of FIG. 1]

In the image capturing in Step 102 and Step 104, a plurality of images may be captured using a plurality of detectors. A plurality of images can be captured, for example, by a secondary-electron detector for detecting a secondary electron, a back-scattering electron detector for detecting a back scattering electron, an X-ray detector for detecting an X-ray emitted from a sample, a transmission particle detector for detecting a particle transmitting through a sample, or the like. In this case, for a first gain and a second gain, the same value may be used for a plurality of images, or different values may be used taking into consideration the fact that a detectable signal amount differs depending on the type of a detector, the arrangement of detectors, and the like.

In capturing a first image or a second image, the image may be captured by irradiating the same region a plurality of times with a charged particle beam and calculating a sum or an average of signals at the same scanning position with respect to the signals obtained in the respective scanning. A first gain value or a second gain value can be also set using design data information regarding a region to be imaged of a sample. Moreover, a second gain value can be also set based on the first image. Note that, in FIG. 1, a method for capturing and combining a first image and a second image has been described, but similarly, as described later in FIG. 10, a third image may be captured using a third gain value, or fourth and subsequent images may be captured. Prior to performing Step 105 or Step 106, image processing for suppressing a noise of the respective images, emphasizing an edge, or reducing a blur of an image may be performed.

Figure 2:
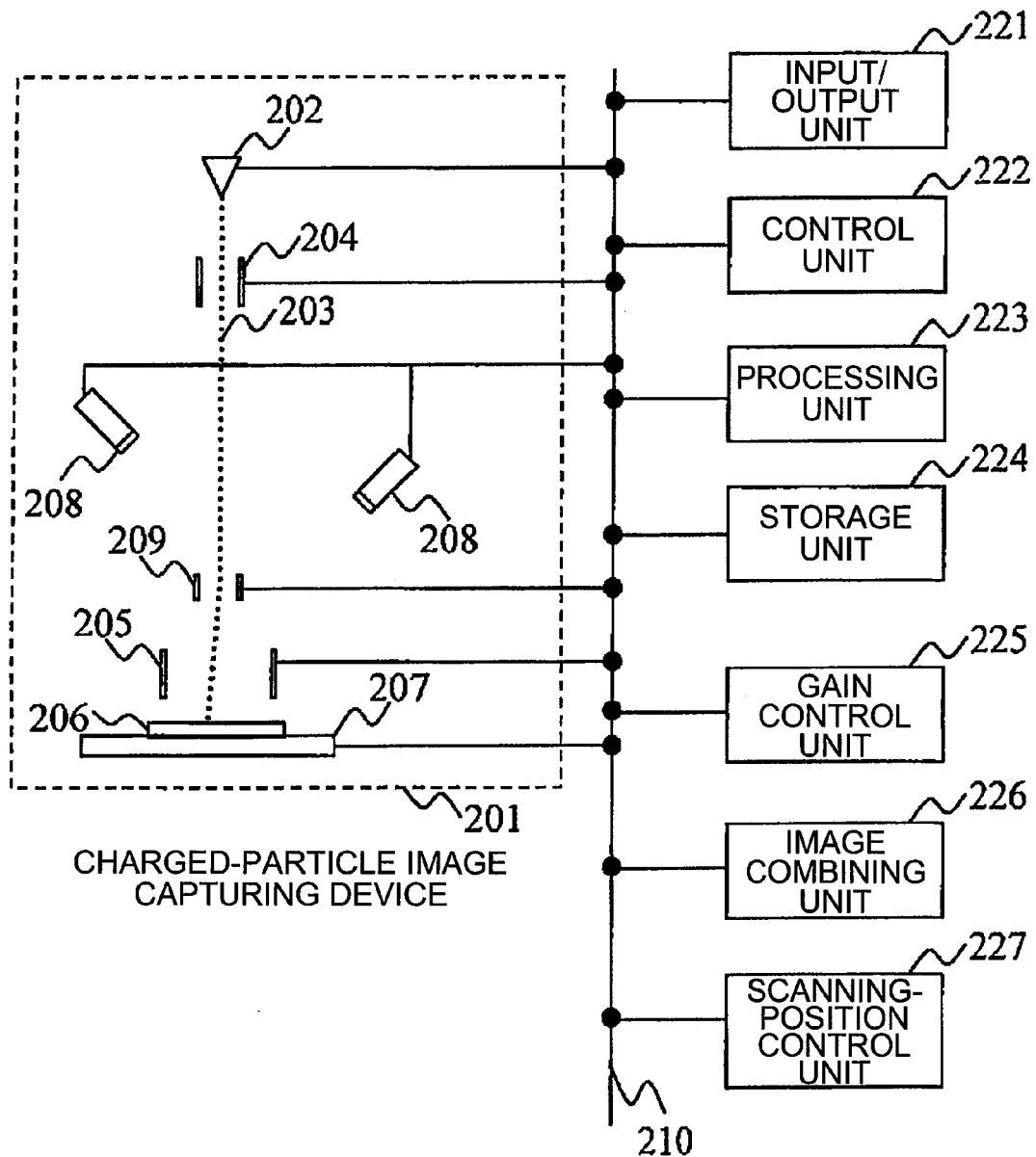
FIG. 2 is a basic configuration of a charged particle microscope that is one embodiment of the present invention.

[Description of FIG. 2]

FIG. 2 is a basic configuration of a charged particle microscope that is one embodiment of the present invention. The charged particle microscope is configured using, as required, for example, a charged-particle image capturing device 201, an input/output unit 221, a control unit 222, a processing unit 223, a storage unit 224, a gain control unit 225, an image combining unit 226, and a scanning position control unit 227, and the like. In the charged-particle image capturing device 201, a charged particle beam 203 is generated from a charged particle gun 202, and the charged particle beam 203 is passed through a condensing lens 204 and an objective lens 205 and is focused on the surface of a sample 206. Next, by detecting particles generated from the sample 206 with a detector 208, an image is captured. The image is stored into the storage unit 224. A plurality of detectors 208 may be included, and furthermore the detector 208 may be detectors for detecting different particles, like a detector for detecting an electron and a detector for detecting an electromagnetic wave, or for example, in the case of a SEM, may be a detector for detecting particles having different characteristics, like a secondary electron detector and a back scattering electron detector. In the case where a plurality of detectors are included, typically one-time imaging can capture a plurality of images. The sample 206 is in contact with a stage 207 whereby moving the stage 207 allows for capturing of an image at any position of the sample. Moreover, the direction of the charged particle beam 203 is two-dimensionally varied by a beam deflector 209, so that the surface of the sample can be scanned with the charged particle beam. According to this example, the gain of the detector can be set to different gain values to capture the respective images corresponding to the different gain values, and the captured images can be combined using the gain values that were used in capturing the images. Moreover, a region of a small signal amount can be scanned again to capture an image, and the captured images can be combined.

In the input/output unit 221, inputting of an image capturing position or an imaging condition, outputting of an image after combining, and so on are performed. In the control unit 222, the adjustment of a voltage applied to the charged particle gun 202 or the like, the adjustment of the focus positions of the condensing lens 204 and the objective lens 205, the movement of the stage 207, and the like are controlled as the controlling of the imaging device. Moreover, the control unit 222 also controls the input/output unit 221, the processing unit 223, the storage unit 224, the gain control unit 225, and the image combining unit 226. In the processing unit 223, various processings are performed, for example, such as the processing related to automatic focusing that is required in order to focus the focal point of the charged particle beam 203 onto the surface of the sample 206. In the storage unit 224, a first image, a second image, an image after composition, design data information, various processing parameters, and the like are stored. In the gain control unit 225, a first gain value and a second gain value are calculated. In the image combining unit 226, a first image and a second image are combined and an image after composition is output. In the scanning position control unit 227, the position on the sample 206 to be scanned with the charged particle beam 203 is controlled.

Figure 3:
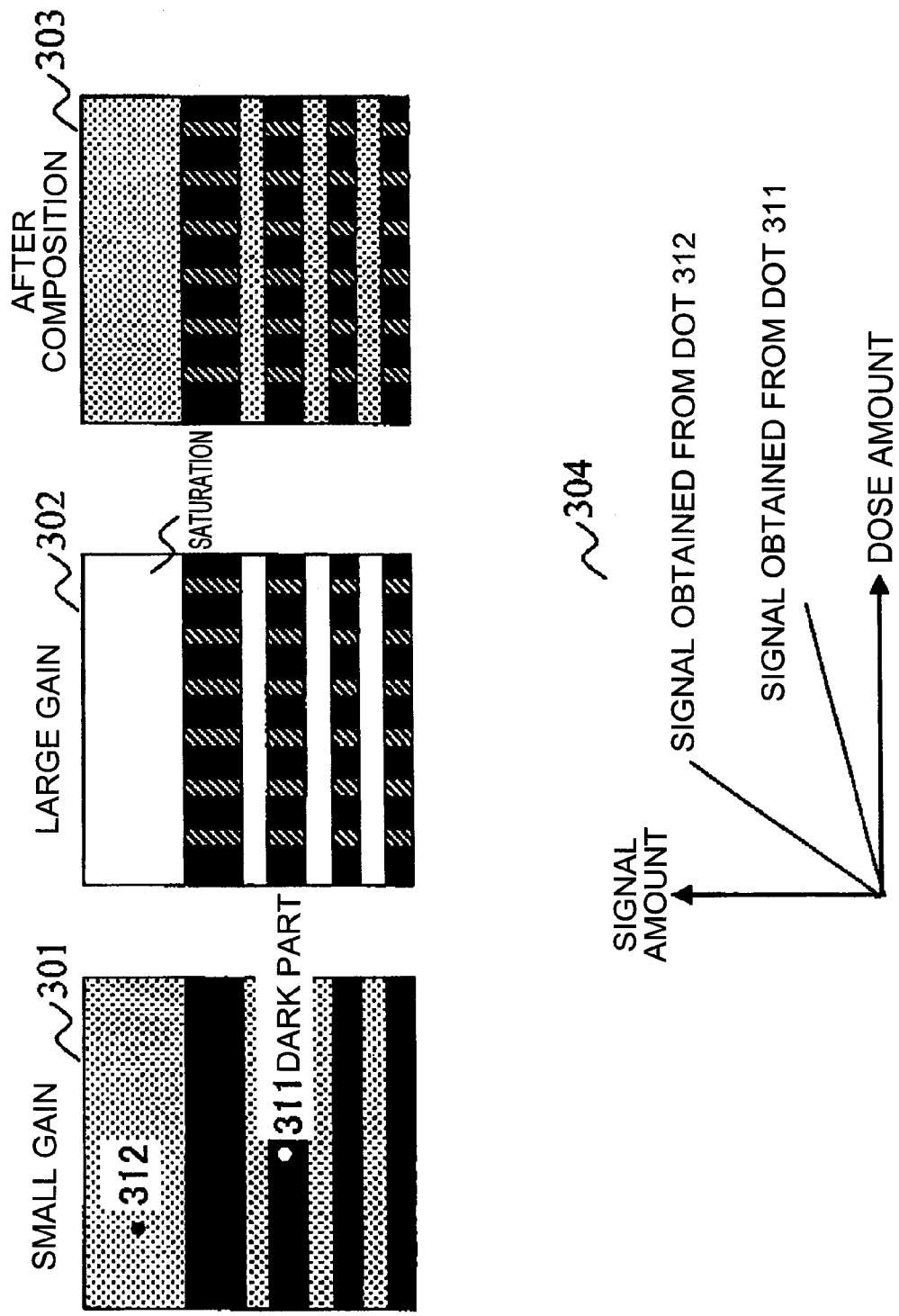
FIG. 3 is a view of an effect of a method for combining images that are captured with varied gain values.

[Description of FIG. 3]

FIG. 3 is a view showing that the present invention allows an excellent image quality to be obtained in an entire region including a dark part. FIG. 3 shows a first image 301, a second image 302, and an image 303 after composition, respectively. In this example, a first gain value is set so as to provide an appropriate lightness value in a region other than the dark part, and a second gain value is set to a value larger than the first gain value so as to be able to obtain a more signal amount in the dark part. The sample to be imaged includes a multilayer pattern, in which an underlayer region is a dark part where a signal is difficult to be obtained. A dot 311 represents one point in the dark part, and a dot 312 represents one point in a region other than the dark part. In the dark part, in the first image 301 the underlayer region is very difficult to be recognized, while in the second image 302, the underlayer region is clearly shot and thus a lower layer pattern can be easily seen. In a region other than the dark part, in the second image 302 the lightness value saturates because the gain value is large, while in the first image 301, an appropriate lightness value is obtained. A graph 304 represents a relationship between a dose amount and the signal amount obtained from the sample. The signal amount is generally proportional to the dose amount, but under the condition of the same dose amount, the signal amount obtained from the dot 311 in the dark part is small as compared with the signal amount obtained from the dot 312 in a region other than the dark part, and therefore in order to clearly display, the gain value needs to be increased to capture an image, as with the second image. By combining the first image and the second image, an image having the underlayer region clearly displayed therein in addition to suppressing the saturation of the lightness value in the entire region of the image can be obtained like the composite image 303.

[Description of FIG. 4]

FIG. 4 is one example view pertaining to a method for setting a gain value. A graph 401 shows a relationship between the type of image information (a first image and a second image) and the gain value in the images 301 and 302. A graph 402 shows a lightness value 411 at the dot 311 and a lightness value 412 at the dot 312, respectively. In the first image, the lightness value of the dark part is very small as indicated by the lightness value 411, and is liable to be affected by a thermal noise and/or a quantization noise overlapping after detection. In the second image, in a region other than the dark part there is also a place where the lightness value saturates as indicated by the lightness value 412. As described earlier, by combining the images, both the suppression of saturation of the lightness value in a region other and the clear displaying of the dark part can be achieved. Note that, like a graph 403, a second gain value may be smaller than a first gain value, and furthermore a third image and a fourth image may be captured using a third gain value and a fourth gain value.

[Description of FIG. 5]

FIG. 5 is one example view showing a specific process of Step 103 of calculating a second gain. First, in Step 501, a dark part in a first image is extracted. In the extraction of a dark part, various segmentation approaches known as an approach for extracting a region can be used. For example, a dark part can be also extracted as a region where the lightness value of an image falls below a certain threshold value, or can be also extracted by performing a post treatment, such as enlargement or reduction, on the extracted region. The threshold value for extracting a dark part may be varied for each local region of an image. Next, in Step 502, an average lightness of a dark part is calculated. Finally, in Step 503, a second gain value is calculated based on the calculated average lightness of a dark part. A relationship between the average lightness of a dark part and the second gain value is a monotonically decreasing relationship like a graph 511. That is, the second gain value is increased so that the smaller the average lightness of a dark part in the first image, the larger the average lightness becomes in the second image.

[Effect of FIG. 5]

Thus, the lightness value of a dark part is calculated using a first image, and based on this result a second gain value is adjusted, so that the lightness value of a dark part in a second image can be set to an appropriate value and the second image having a dark part more clearly displayed therein can be captured.

[Complement of FIG. 5]

In FIG. 5, the second gain value is calculated based on the average lightness of a dark part, but a value other than the average lightness can be also used. For example, in the case of an image having an average lightness that tends to fluctuate with noises, a median of the lightness values of a dark part may be used instead. As another example, in the case where a pattern is expected to be included in a dark part, the pattern and other region may be distinguished from the dark part (e.g., by regarding a relatively bright region as the pattern) and then a difference between the average lightness of the respective regions may be used. A relationship between the average lightness of a dark part and a gain shown in a graph 511 may be inverse proportional, for example, but not limited thereto.

[Description of FIG. 6]

FIG. 6 is an example view different from FIG. 5, showing a specific process of Step 103 of calculating a second gain. First, in Step 601, a dark part in a first image is extracted. Next, in Step 602, design data and the first image are compared. Finally, in Step 603, based on this comparison result a second gain value is calculated. Here, the design data represents data indicative of shape information of a semiconductor pattern to manufacture, and in many cases, information regarding the contour of a semiconductor pattern or the expected shape, layer characteristics, and the like obtained by litho-simulation or the like are described. Moreover, the design data may include information regarding sample characteristics (material properties, electrical characteristics, and the like).

A flow 610 shows a data flow of comparing design data and a first image. In Step 601, a dark part in a first image 623 is extracted. At this time, information of design data 621 may be used. The design data 621 is cut out in advance so as to display the same region as the region of the first image. Next, in Step 611, the edge of a dark part included in the design data is extracted. An edge extraction result is shown in an image 622. In the example of the design data 621, a vertical line indicative of an edge of an underlayer region is extracted. Next, in Step 613, an edge amount in a dark part included in the first image is calculated. In this calculation, for example, in a region in a vicinity of an edge position extracted in the image 622, an edge amount in the first image is calculated. For the edge amount in the first image, for example a differential filter, such as a Sobel filter or a Laplacian filter, may be used or a more sophisticated filter may be used. An edge amount 624 in a dark part that is an output of Step 613 is utilized in calculating a second gain value in Step 603. The calculation is performed such that the smaller the edge amount 624 in a dark part, the larger the second gain value becomes.

[Effect of FIG. 6]

In this manner, by utilizing design data, more information regarding a dark part, such as the information regarding the position of an edge included in the dark part and the layer characteristics, which are difficult to be obtained from the first image, can be obtained. Therefore, in the process of extracting a dark part in the first image of Step 601, the dark part can be precisely extracted. Moreover, in the process of Step 602, of comparing the design data and the first image, information of whether or not a pattern is included in a dark part, where a pattern is included, and the like are obtained from the design data and therefore the gain value of the second image can be appropriately set utilizing these information.

[Complement of FIG. 6]

In the flow 610, a method for comparing design data and a first image has been described, but when a third image is captured with a similar method, the design data and the second image may be compared, or the design data and two images, i.e., the first image and the second image, may be compared.

Figure 10:
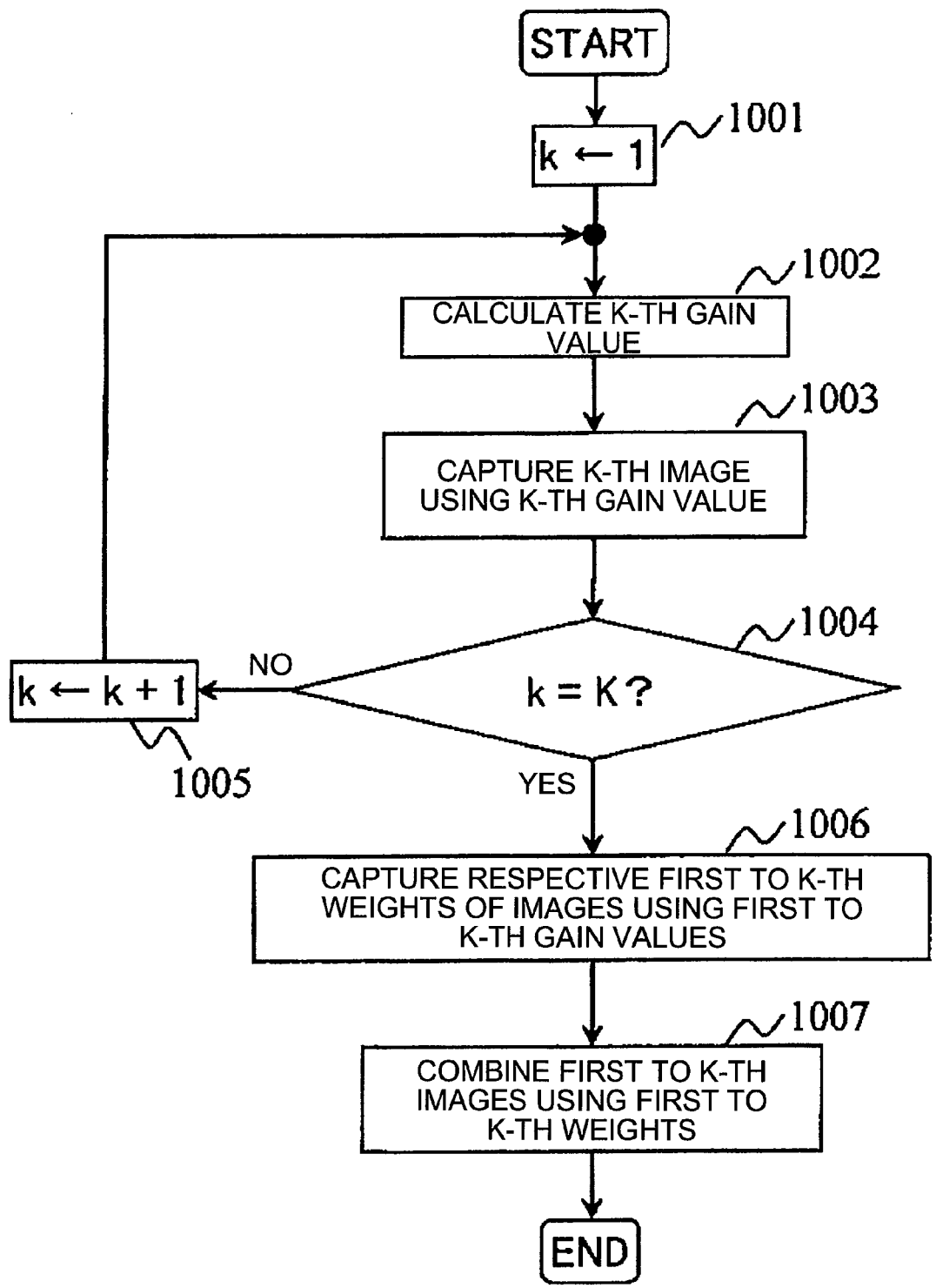
FIG. 10 is one example view of a sequence of capturing the first to k-th images and combining the k images.

[Description of FIG. 10]

FIG. 10 is one example view showing a process of varying the gain value to a value k (k≥3), capturing the first to k-th images, and combining these k images. First, in Step 1001, 1 is substituted into k. Next, in Step 1002, the k-th gain value is calculated, and in Step 1003 the k-th image is captured using the k-th gain value. Next in Step 1004, whether or not k is equal to K is checked, and if not equal, then in Step 1005, 1 is added to k, and Steps 1002 to 1004 will be repeated. In Step 1004, if k is equal to K, then in Step 1006, the respective weights of the first to k-th images are calculated using the first to k-th gain values, and in Step 1007 the first to k-th images are combined using the calculated weights of the images. Note that, when k is 2, the process is the same as the process of the example view of FIG. 1.

[Effect of FIG. 10]

By setting k equal to or greater than 3, a further excellent image quality can be obtained in cases where the lightness values spread very widely in an image. For example, in the case where there are roughly three regions in an object to be imaged, i.e., a dark part where the signal amount is difficult to be obtained, a dark part where a certain signal amount can be obtained despite the same dark part, and a region other than the dark part, an appropriate gain value can be set in any region by setting three types of gain values as shown in FIG. 10 rather than setting two types of gain values as shown in FIG. 1.

[Description of FIG. 7]

FIG. 7A to FIG. 7C show one example view of the process, which is the process of Step 105 in FIG. 1, of calculating a weight of the first image and a weight of the second image using the first gain value and the second gain value. FIG. 7A shows an example of calculating a weight $w_k$ of the k-th image as $w_k = c/g_k$ for the k-th gain value $g_k$ (k=1, 2, ...) (where, c is a constant). When a lightness value of an image is proportional to a gain value and a signal amount, by multiplying the lightness value by a weight in inverse proportion to a gain value, a lightness value with a magnitude proportional to the signal amount without depending on the gain can be obtained. Although the magnitude of a lightness value will not depend on a gain value any more, a larger gain value yields less thermal noise and/or quantization noise included in a lightness value and therefore a clear image can be obtained in a dark part. As required, weights are normalized so that a total sum of weights becomes one. FIG. 7B shows an example of calculating the weight $w_k$ of the k-th image as $w_k = c_k/(g_k + p_k)q_k$ (where, $c_k$, $p_k$, and $q_k$ are constants). As compared with the calculation method of Step 701, weight setting with a higher degree of freedom is possible. Moreover, FIG. 7C shows an example of calculating the k-th weight $w_k$ as $w_k(x, y) = f_k(d_k(x, y), g_1, g_2, \ldots, a_1(x, y), a_2(x, y), \ldots)$, as an example of weigh setting with a much higher degree of freedom. Here, (x, y) is a position coordinate (x, y-coordinate) on an image, $d_k(x, y)$ is a dark part level at a position (x, y) of the k-th image, $a_j(x, y)$ is a lightness value at the position (x, y) of the j-th image, and $f_k$ is a function. The dark part level $d_k(x, y)$ is a level representing the degree of a dark part, and is a value that is calculated in Step 703 using the lightness value $a_k(x, y)$. For example, the dark part level $d_k(x, y)$ is calculated as $d_k(x, y)=1/(1+\exp(s(a_k(x, y)-a_0))$ using a Sigmoid function (here, $s$ and $a_0$ are constants). In this example, a weight is calculated using the lightness value of an image and the weight is calculated for each position on an image. Moreover, the dark part level is also taken into consideration. Furthermore, in calculating the k-th weight $w_k$, lightness values other than the lightness value of the k-th image are also used. A sum of weights is normalized so as to be one, for example.

[Effect of FIG. 7]

In this manner, the lightness value of an image after composition can be kept so as to be an appropriate value by calculating the weight using a gain value. On the contrary, if a weight is not calculated using a gain value, a dark part may be too bright or too dark in an image after composition, which might damage the image quality.

[Complement of FIG. 7]

Note that, in Step 701, a weight inversely proportional to a gain value is set so that the magnitude of a lightness value will not depend on a gain value. If a weight is set in this manner, the ratio of the lightness of a dark part and the lightness of a region other than the dark part can be kept so as to be the same as the case where a conventional image capturing method for capturing an images using a constant gain value is used. However, the process of keeping such a ratio of lightnesses so as to be the same is not necessarily important, and for example, in order to clearly display a dark part, an image with a brighter dark part and/or an image with a high contrast of a dark part may be desired to be generated. In such a case, the weight calculation method as shown in Step 702 or Step 703 can be used. Moreover, after capturing an image, a process of emphasizing a dark part by separate image-processing can be also performed. Even in the case of subsequently performing image processing, influence of a noise can be reduced in a dark part according to the present invention and therefore a further excellent image can be obtained.

[Description of FIG. 8]

FIG. 8A to FIG. 8C show one example view of the process, which is the process of Step 106 in FIG. 1, of combining the first image and the second image using the weights calculated in Step 105. In FIG. 8A, in Step 801 a lightness value $b(x, y)$ of an image after composition is calculated by performing a weighted combining process as shown in Mathematical Formula 1.

$$b(x, y)=w_1 a_1(x, y)+w_2 a_2(x, y)+ \quad (1)$$

FIG. 8B shows an example added by a process of excluding a lightness value from the target of composition if it saturates. In Step 811, it is determined, for all the lightness values $a_k(x, y)$, whether or not the lightness value $a_k(x, y)$ saturates, and if the lightness value $a_k(x, y)$ saturates, the lightness value is replaced as shown in Mathematical Formula 2.

$$a_k(x, y)=a_{k-1}(x, y) \times w_{k-1}/w_k \quad (2)$$

$a_k(x, y)$ is replaced in accordance with Mathematical Formula 2 in an ascending order of k. With regard to the determination of whether or not a lightness value saturates, for example if the lightness value is equal to or greater than a certain value, it may be regarded as saturating. Next, in Step 812, the weighted combining process shown in Mathematical Formula 1 is performed to calculate the lightness value $b(x, y)$ of an image after composition. By replacing as shown in Mathematical Formula 2, $a_k(x, y)$ can be replaced so as to satisfy a relationship of $w_k a_k(x, y)=w_{k-1} a_{k-1}(x, y)$, and $a_k(x, y)$ can be essentially excluded from the target of composition. Note that, other than the process of FIG. 8B, a process of excluding a lightness value from the target of composition if it saturates can be contemplated. For example, if a lightness value saturates, the corresponding weight $w_k$ may be set to zero (in this case, for each position (x, y), the normalization of weights is performed anew). The determination of whether or not a lightness value is excluded from the target of composition is performed for each local region. This local region may be each pixel, or may be several pixels nearby, or may be a result of performing on an image a process (segmentation process) of dividing a region into similar regions.

FIG. 8C shows another example different from FIG. 8A and FIG. 8B. In Step 821, j corresponding to the lightness value $a_j(x, y)$, which becomes the maximum within a range smaller than a certain threshold value $T_j$, is set to k, and the lightness value $b(x, y)$ of an image after composition is calculated as $b(x, y)=w_k a_k(x, y)$. The threshold value $T_j$ is a value indicating whether or not a lightness value saturates. When the lightness value $a_j(x, y)$ is larger than $T_j$ for any j, k providing the smallest gain value is selected. Thus, images can be combined using a sufficiently large lightness value $a_k(x, y)$ after suppressing saturation at any position (x, y).

[Effect of FIG. 8]

According to the examples of FIG. 8A to FIG. 8C, appropriate composition can be performed even if a lightness value saturates in a region other than a dark part, and an excellent image quality can be obtained in the entire region. If there is at least one gain value that will not cause saturation in the entire region, an image that will not saturate in the entire region during combining images can be produced even if other gain value is set to a large value that causes saturation in a region other than a dark part. Therefore, the gain value can be set to a large value and thus less-noisy information can be obtained in a dark part.

[Complement of FIG. 8]

Note that, in FIG. 8, the lightness value $b(x, y)$ of an image after composition is calculated as a product of the weight $w_k$ and the lightness value $a_k(x, y)$, but not limited thereto. Moreover, in calculating $b(x, y)$, the weight and/or lightness value (e.g., $w_k(x-1, y)$ and/or $a_k(x-1, y)$) at other position may be used.

Figure 9:
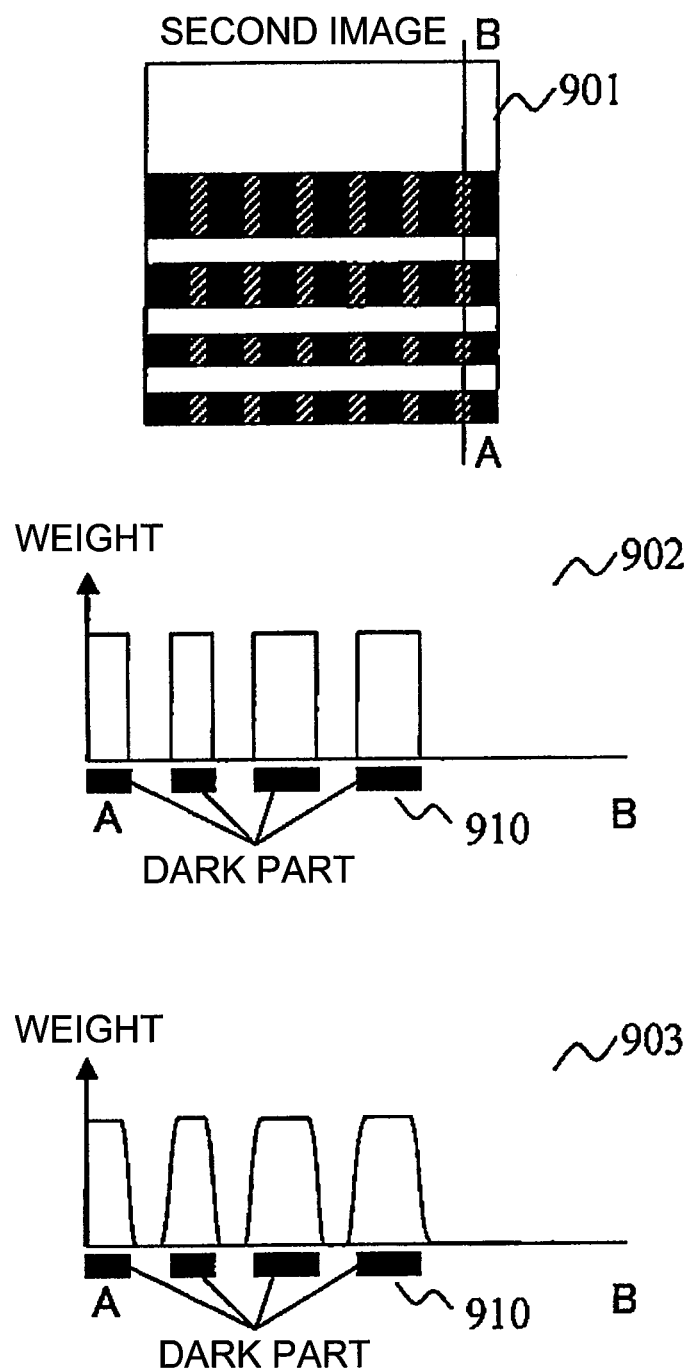
FIG. 9 is one example view of a sequence of calculating a weight of a first image and a weight of a second image.

[Description of FIG. 9]

FIG. 9 is one example view representing a process for preventing the lightness value of an image after composition from becoming unnaturally discontinuous in combining images using weights. The value of a weight along a cross section AB of an image 901 is shown in a graph 902. A black mark 910 indicated in the graph 902 represents a dark part. In the graph 902, the weight abruptly varies between a dark part and a region other than the dark part. When composition is performed as shown in FIG. 8 using such weights, an unnatural discontinuity is generated in the lightness value between a dark part and a region other than the dark part in an image after composition, thus causing a degradation in image quality. On the other hand, like a graph 903, by gradually varying the weight, the lightness value can be prevented from becoming unnaturally discontinuous. In order to set the weight like the one shown in the graph 903, a smoothing process may be performed on the weight calculated from FIG. 7, for example.

Figure 11:
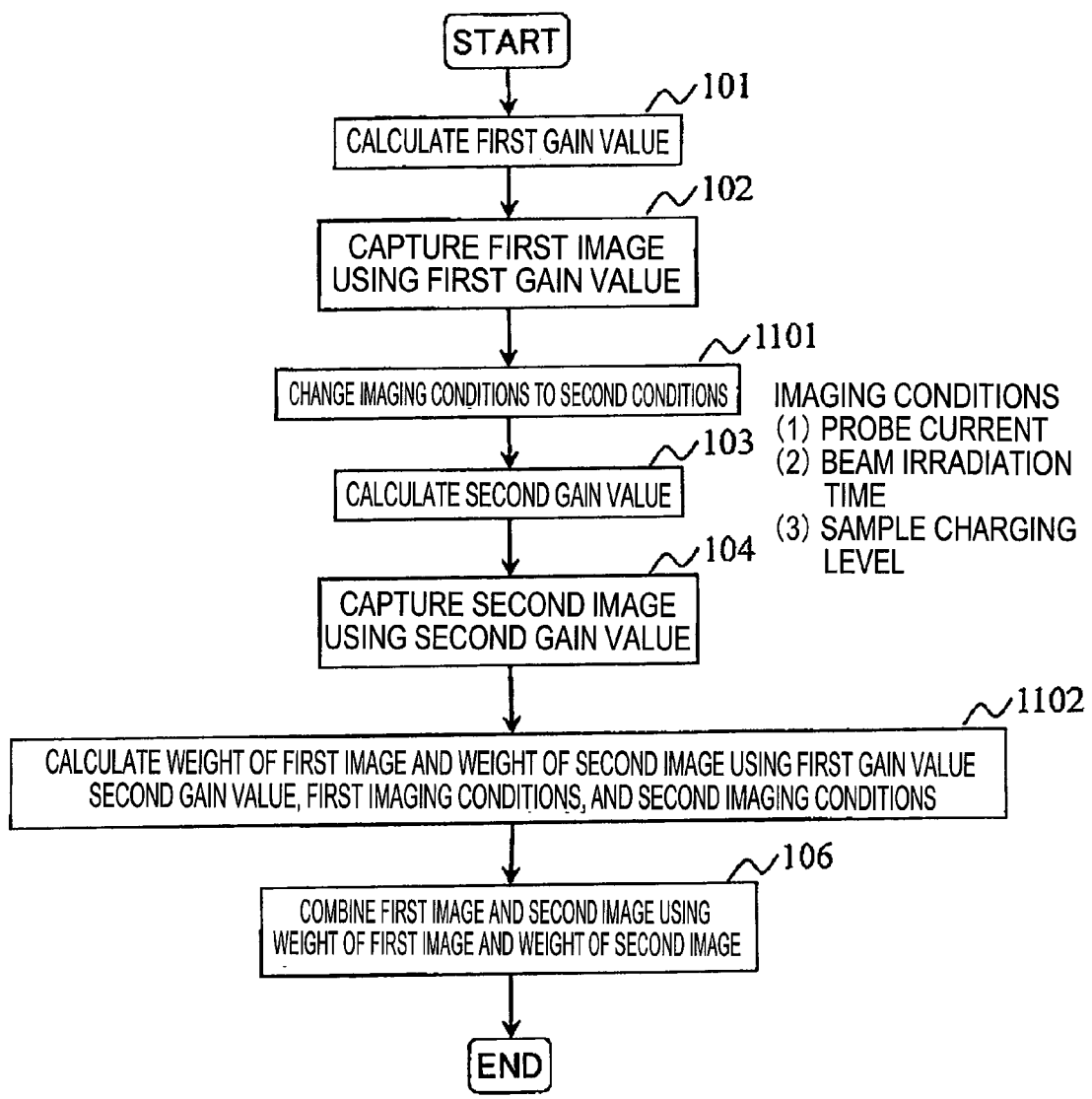
FIG. 11 is one example view of a sequence of capturing a second image under an imaging condition different from an imaging condition when the first image is captured.

[Description of FIG. 11]

FIG. 11 is one example view representing a process of capturing a second image under an imaging condition different from an imaging condition under which a first image is captured. Here, the imaging condition refers to either of a probe current, a beam irradiation time, or a sample charging level. The same process as the process of FIG. 1 is indicated by the same number as FIG. 1. A similar process will be described while being omitted as needed Hereinafter, when the same process, data, or the like is shown, it shall be designated by the same number attached thereto. Steps 101 and 102 are the same as those of FIG. 1. Next, in Step 1101, the imaging condition is changed to a second condition. Subsequently, in Steps 103 and 104, a second gain value is calculated and a second image is captured using this gain value. In Step 1102, a weight of the first image and a weight of the second image are calculated using the first gain value, the second gain value, the first imaging condition, and the second imaging condition. Finally, in Step 106, the first image and the second image are combined using the weights of the images. Here, the probe current is a value representing the amount of a charged particle beam irradiated per unit of time. Moreover, the sample charging level is an amount representing a level at which a sample is charged. When a sample is irradiated with a charged particle beam, the sample will absorb and emit a charged particle and therefore the sample has a positive or negative electric characteristic around an irradiated position. A sample will be charged because the sample is irradiated with a charged particle beam in capturing an image. Here, charging a sample by processing, such as pre-charging, is referred to as "changing the sample charging level".

[Effect of FIG. 11]

Thus, the signal amount obtained from a dark part can be increased. The dose amount can be increased by increasing the probe current and/or the beam irradiation time. Moreover, by adjusting the sample charging level to an appropriate value, more charged particles emitted from a sample can be detected. For example, when a first image is captured, these values are set to values that are usually used, while when a second image is captured, a condition is set, under which the signal amount obtained from a dark part increases. In capturing the second image, appropriate information does not need to be obtained in a region other than a dark part, and therefore a condition can be used, under which the signal amount from a dark part can be obtained as much as possible.

[Complement of FIG. 11]

In varying the beam irradiation time, a speed at which a sample is scanned with a beam may be varied, or the number of times of scanning the same region with a beam may be varied. Note that, prior to combining the first image and the second image in Step 106, image processing for suppressing noise, emphasizing an edge, and/or reducing a blur of an image may be performed on the respective images. At this time, the image processing may be performed on the respective images using the information of imaging conditions. For example, the degree of a blur of an image varies with the probe current, but by combining the images after reducing the blur of an image by image processing using the respective imaging conditions, an image having the blur appropriately reduced in the entire region can be obtained.

Figure 12:
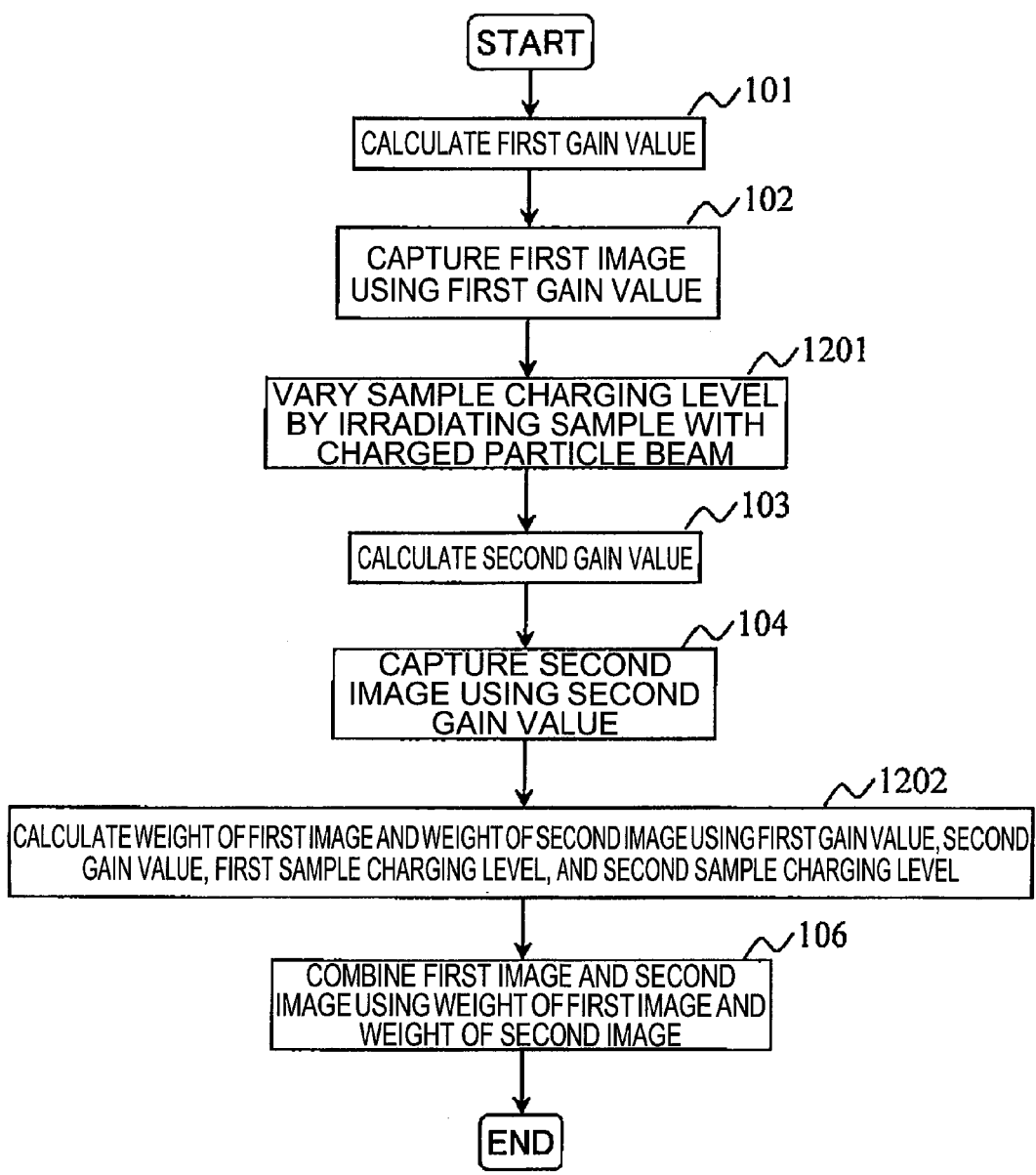
FIG. 12 is one example view of a sequence of varying a sample charging level and then capturing a second image.

[Description of FIG. 12]

FIG. 12 is one example view of a sequence of capturing a second image under an imaging condition different from an imaging condition when a first image was captured, and in particular is one example view of a sequence of varying the sample charging level and capturing a second image. A first image is captured in Steps 101 and 102, and then in Step 1201, the sample charging level is varied by a process of irradiating a sample with a charged particle beam, called pre-charging. Next, in Steps 103 and 104, a second image is captured, and then in Step 1202, a weight of the first image and a weight of the second image are calculated using a first gain value, a second gain value, a first sample charging level, and a second sample charging level. Finally, in Step 106, the first image and the second image are combined using the above-described weights of the images.

[Effect of FIG. 12]

This allows for a process, in which the signal amount obtained from a dark part is increased by charging a sample to a state where particles emitted from a sample are easy to be output.

[Complement of FIG. 12]

The sample charging level may be a quantity directly representing the charging level of a sample, or may be a certain value related to the charging level of a sample. For example, in Step 1201 the irradiation amount irradiated with a charged particle beam can be set to a sample charging level. In Step 1201, in charging a sample, a region larger than the region to be imaged of a sample is typically irradiated with a charged particle beam. In this example, a method for varying a sample charging level by irradiating a sample with a charged particle beam has been shown, but other method for varying a sample charging level may be used. For example, the sample charging level can be varied also by irradiating a sample with an X-ray.

Figure 13:
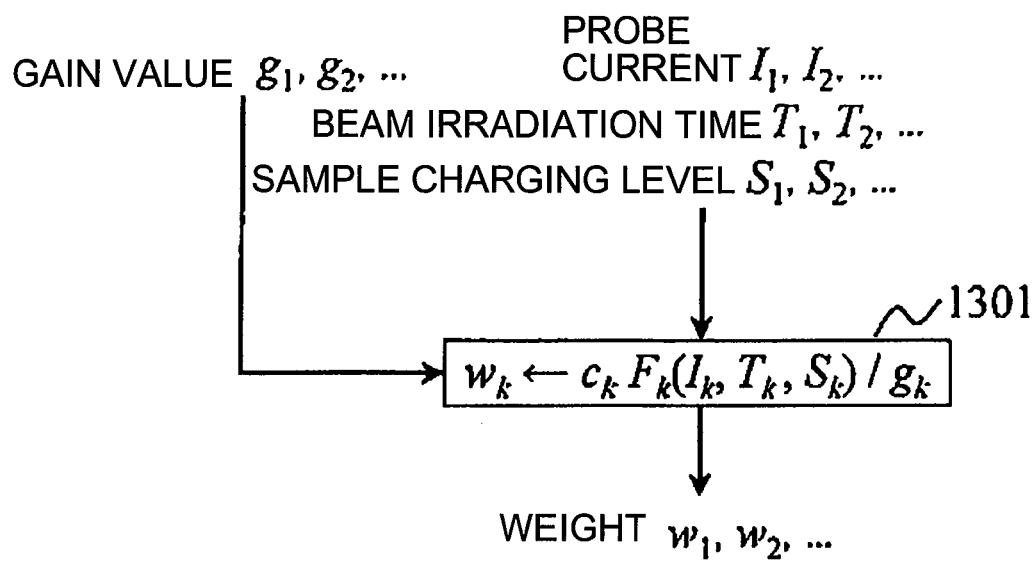
FIG. 13 is one example view of a sequence of calculating a weight using a gain value and an imaging condition.

[Description of FIG. 13]

FIG. 13 is one example view of a process of calculating a weight using a gain value and an imaging condition. When the probe current is $I_k$, the beam irradiation time is $T_k$, and the sample charging level is $S_k(s)$ as the imaging conditions in capturing the k-th image, the weight $w_k$ is calculable as shown in Mathematical Formula 3.

$$w_k = c_k F_k(I_k, T_k, S_k)/g_k \quad (3)$$

Here, $c_k$ is a constant and $F_k$ is a function. The function $F_k$ may be selected so as to be proportional to $I_k$, $T_k$, and $S_k$, for example, or may be other relational expression.

[Effect of FIG. 13]

In this manner, a weight is set in accordance with an imaging condition, so that for an image providing a more signal amount, the weight can be set larger, and therefore an image of an excellent image quality can be synthesized.

Figure 14:
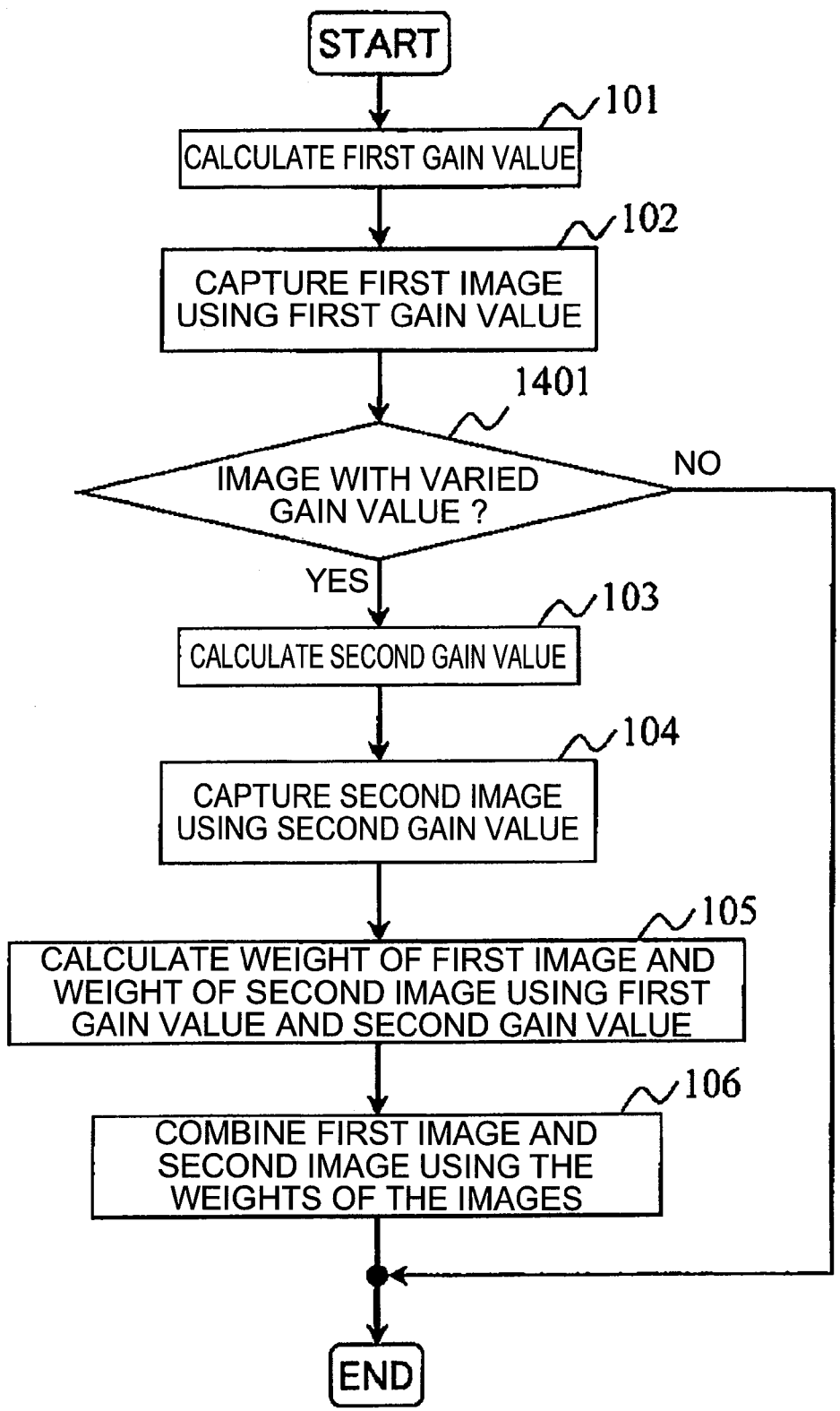
FIG. 14 is one example view of an imaging sequence including a process of determining whether or not to image with a varied gain value.

[Description of FIG. 14]

FIG. 14 is one example view of an imaging sequence including a process of determining whether or not to image with a varied gain value. First, in Steps 101 and 102, a first image is captured, and then in Step 1401 it is determined whether or not to image with a varied gain value. If it is determined to image with a varied gain value, then in Steps 103 to 106, a second image is captured and the first image and the second image are combined. On the other hand, if it is determined, in Step 1401, not to image with a varied gain value, Steps 103 to 106 will not be performed. In an example of this sequence, the first gain value is set to a value by which an image will not saturate in regions other than a dark part, while the second gain value is set to a large value enough to be able to emphasize the dark part.

[Effect of FIG. 14]

Thus, imaging can be performed so that a second image is captured and is combined only when a dark part in a region to be imaged needs to be emphasized. When a dark part needs to be emphasized, an image, which provides an excellent image quality even in the dark part, can be captured by an image combining method, while when a dark part does not need to be emphasized (e.g., when there is no dark part in a region to be imaged), an image of an excellent image quality can be captured at high speed without capturing a second image.

[Complement of FIG. 14]

In the process, in Step 1401, of determining whether or not to image with a varied gain value, at least one of design data and a first image can be used. Alternatively, a gain value may be manually adjusted by a user in advance, or the determination may be performed using a request value for the imaging time, for example. Steps 103 to 106 do not necessarily need to be performed immediately after capturing a first image, but may be performed after an adequate time elapsed or after performing other processes. Moreover, when not only a first image and a second image but a third image are captured, there may be a step of determining whether or not to capture both the second image and the third image, or a step of determining whether or not to capture only the second image or whether or not to capture only the third image.

Figure 15:
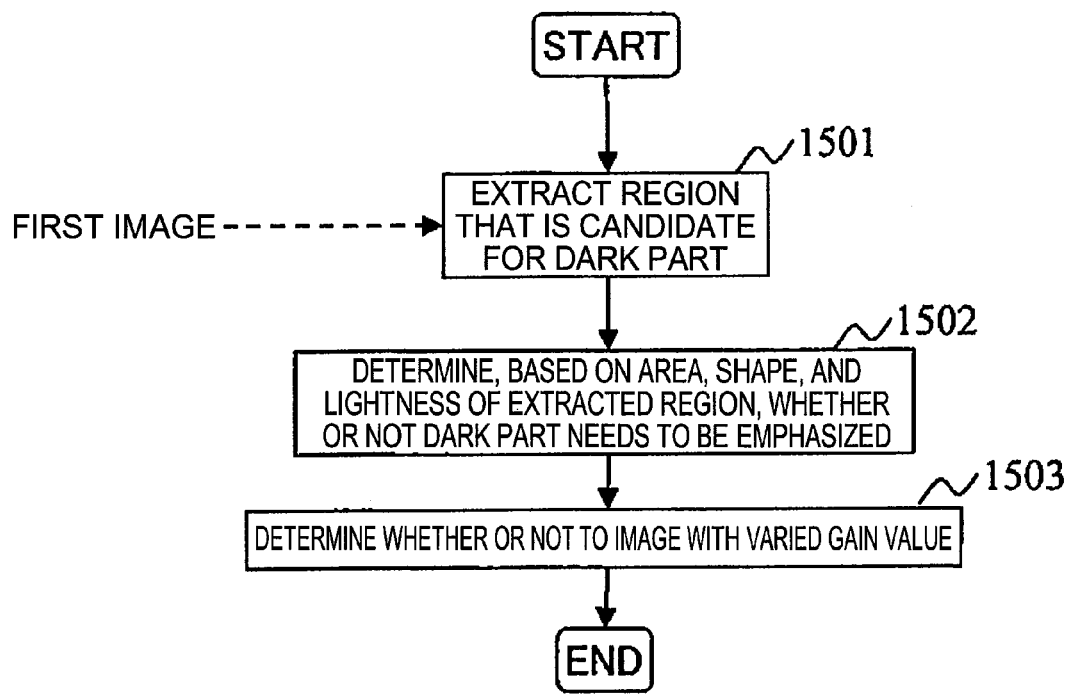
FIG. 15 is one example view of the process of determining whether or not to image with a varied gain value.

[Description of FIG. 15]

FIG. 15 is one example view of a sequence of determining whether or not to image with a varied gain value of Step 1401 of FIG. 14. First, in Step 1501, with respect to the first image, a region that is a candidate for a dark part is extracted. The region that is a candidate for a dark part can be calculated, for example, as a region where a lightness value is equal to or less than a threshold value. Next, in Step 1502, it is determined, based on the area and/or shape of the extracted region, whether or not a dark part needs to be emphasized. For example, if the region that is a candidate for a dark part occupies an area equal to or greater than a certain area, it is determined to emphasize the dark part. The determination may be performed using only design data or the determination may be performed using both the design data and the first image. Finally, in Step 1503, based on a result of the determination of whether or not a dark part needs to be emphasized, it is determined whether or not to image with a varied gain value. Usually, if a dark part needs to be emphasized, an image may be captured with a varied gain value, or otherwise the determination may be performed so as not to image, but not limited thereto. For example, in the case where a dark part needs to be emphasized but it is apparent before imaging, that a significant effect cannot be expected even if an image is captured with a varied gain value, or in the case where due to other constraints (imaging time and the like), imaging capable of emphasizing a dark part cannot be performed, it may be determined not to image with a varied gain value.

[Description of FIG. 16]

FIG. 16 is one example view of a log to output during image capturing. Once an images is captured, information regarding imaging conditions is output as a log 1601 usually in the form of electronic data. In the log 1601, information, such as the date and time of imaging, an acceleration voltage, a probe current, and the like that are imaging conditions, are described. Moreover, the information used in combining images according to the present invention is also output to the log. For example, a first gain value and a second gain value are output as indicated by reference sign 1602. Moreover, a first weight and a second weight are output as indicated by reference sign 1603. In the case where a second image is captured with a varied imaging condition as with the sequence of FIG. 11, a second imaging condition (probe current or the like) is output as indicated by reference sign 1604. Furthermore, as detailed information, as indicated by reference sign 1605, for example, the area of a region, where a lightness value saturates, in the second image, a list of the results obtained by calculating the dark part level in Step 703, and the like may be output. Reference sign 1610 indicates a set of the first image to k-th image captured in the sequence of FIG. 10. All or some of the captured images are stored as a log so that a detailed analysis can be performed later or composition can be performed with varied weights.

[Effect of FIG. 16]

In this manner, by outputting parameters used in combining images to a log, the log can be utilized in performing various processings, such as object recognition, detection, and measurement, on a composite image. Moreover, use of both the image and the log enables the detailed analysis on a dark part of a sample, in particular.

[Description of FIG. 17]

FIG. 17 is one example view of a sequence of capturing an image based on a target signal amount once and then capturing an image by scanning a local region again with a charged particle beam. First, in Step 1701, a target signal amount is calculated. Next, in Step 1702, an image is captured. Subsequently, in Step 1703, a signal amount in a region where a signal amount is relatively small is compared with a target signal amount, and then in Step 1704 it is determined, based on this comparison result, whether or not to continue to capture an image. If it is determined to continue to capture an image, then in Step 1705 a local region is scanned with a charged particle beam to capture an image. In Step 1706, the images captured so far and an image newly captured in Step 1705 are combined. Hereinafter, Steps 1703 to 1706 are repeated until it is determined, in Step 1704, not to continue to capture an image.

[Effect of FIG. 17]

Thus, the imaging time can be controlled in accordance with a level of the signal amount obtained from a dark part, and both an increased image quality and high-speed imaging of a dark part can be achieved. Moreover, in capturing a new image, instead of irradiating a sample region corresponding to the entire region of an image with a charged particle beam, only a small sample region including a dark part can be irradiated with a charged particle beam and thus the imaging time can be reduced. Furthermore, demerits, such as a damage on a sample and charging of a sample occurring in irradiating the sample with a charged particle beam, can be reduced.

[Complement of FIG. 17]

Because a lightness value is a value obtained by multiplying a signal amount by a gain value (or is a value further added by a bias), a signal amount can be calculated using a lightness value and a gain value. In Step 1703, in comparing a signal amount in a region of a small signal amount with a target signal amount, a signal amount obtained using a lightness value and a gain value may be compared with the target signal amount. In comparing the signal amount with the target signal amount, the comparison is made for each pixel or the comparison may be made for each local region including a plurality of pixels. Alternatively, an average of the signal amounts in the entire region of a relatively small signal amount may be compared with a target signal amount.

In Step 1704, in determining whether or not to continue to capture an image, the determination may be performed based on an upper limit and a lower limit of the imaging time. Thus, capturing an image, wherein it takes a very long imaging time in order to obtain an image satisfying a target signal amount, or capturing an image, wherein on the contrary it takes a very short imaging time but there is still a sufficient room to obtain an excellent image quality, can be suppressed. In capturing a plurality of images in a row, an upper limit and a lower limit may be set to an individual imaging time, or an upper limit and a lower limit may be set to an average imaging time.

Moreover, in combining the images in Step 1706, a weighted averaging process may be performed using a weight that is appropriately calculated based on the dose amount irradiated with a charged-particle beam in Step 1702 and Step 1705. For the image captured in Step 1705, meaningful information cannot be obtained from a position that is not irradiated with a charged particle beam and therefore in combining images, the weight is set to zero at a corresponding position of a newly captured image.

Figure 18:
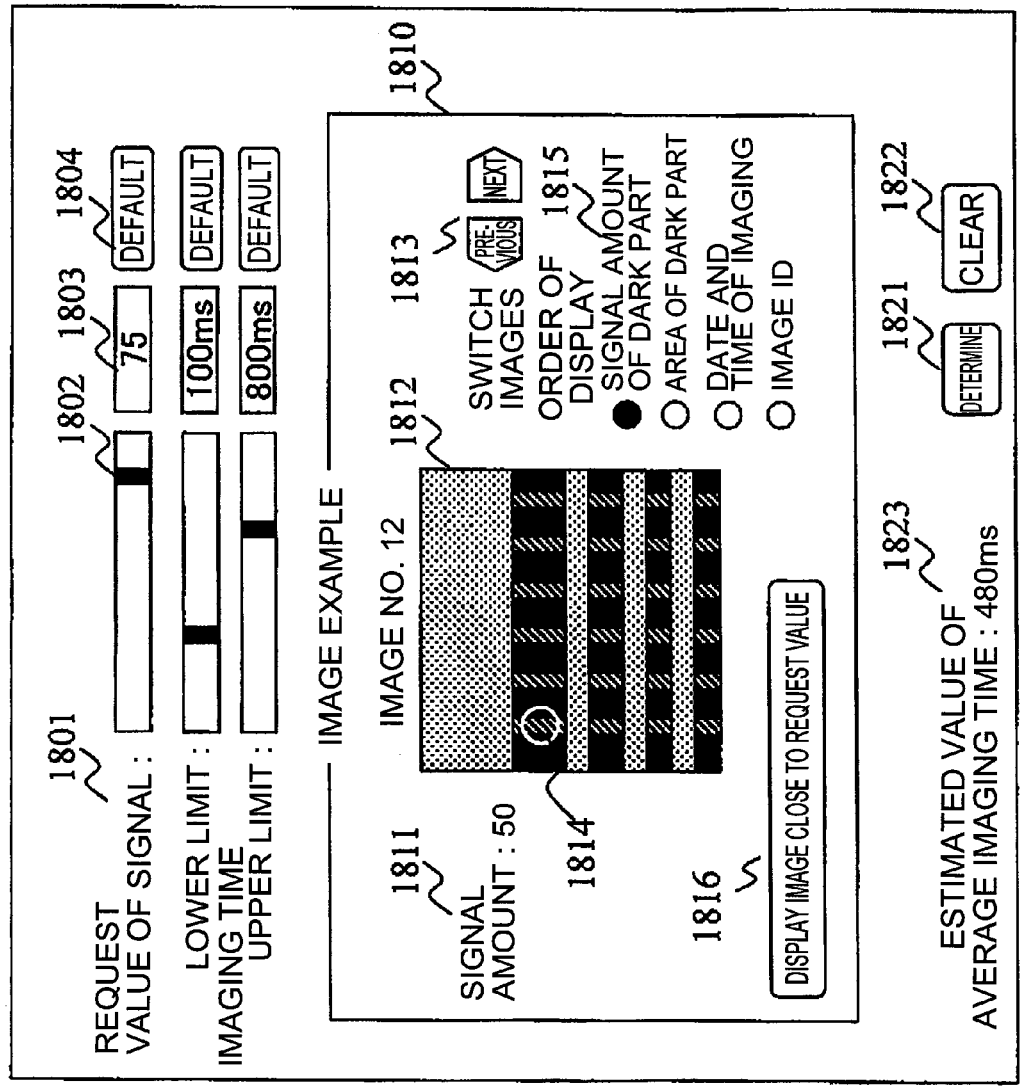
FIG. 18 is one example view of an interface for prompting to input a request value of a signal amount prior to capturing an image.

[Description of FIG. 18]

FIG. 18 is one example view of an interface for prompting to input a request value of a signal amount prior to capturing an image. Reference sign 1801 indicates a list of the items required to be set, such as a request value of a signal amount, a lower limit of the imaging time, and an upper limit of the imaging time. For each item, a value can be set through a scroll bar 1802 or a direct-input column 1803. As indicated by reference sign 1804, a button capable of returning the set value to a default value may be attached. Moreover, as shown in a region 1810, an example of a relationship between a signal amount and an image may be shown using an image. For example, a set of several sample images is prepared, and a screen is provided for simultaneously displaying an image 1812 and a signal amount 1811 in a certain region 1814 in the image. An image to display can be switched with a button 1813. The position of the region 1814 can be freely changed. An interface may be provided for changing the shape of the region 1814. Moreover, there may be a function 1815 to sort images to display, in accordance with a signal amount, and a button 1816 for displaying an image, wherein a signal amount in a dark part of the image is the closest to a current request value of the signal amount. There may be a function 1823 to output the estimated value of an average imaging time.

[Effect of FIG. 18]

Thus, a target signal amount can be calculated taking into consideration S/N or the signal amount which a user requests, and an image having an image quality, with which a user is satisfied, can be captured in as short time as possible.

[Complement of FIG. 18]

In FIG. 18, an interface for prompting to input a request value of a signal amount has been described, but similarly the interface may be an interface for prompting to input a request value of S/N, or a function to allow for a user to select which request value to input may be provided. For the signal amount 1811, an accurate value may be displayed using a log of an image and the like, or the signal amount 1811 may be a value estimated from an image. Moreover, in the case where a plurality of detectors are provided, a plurality of images may be displayed as the image 1812. The signal amount does not need to be necessarily a value whose magnitude can be understood by a user, and a user can set a request value of the signal amount by performing a relative comparison based on an example of images.

Figure 19:
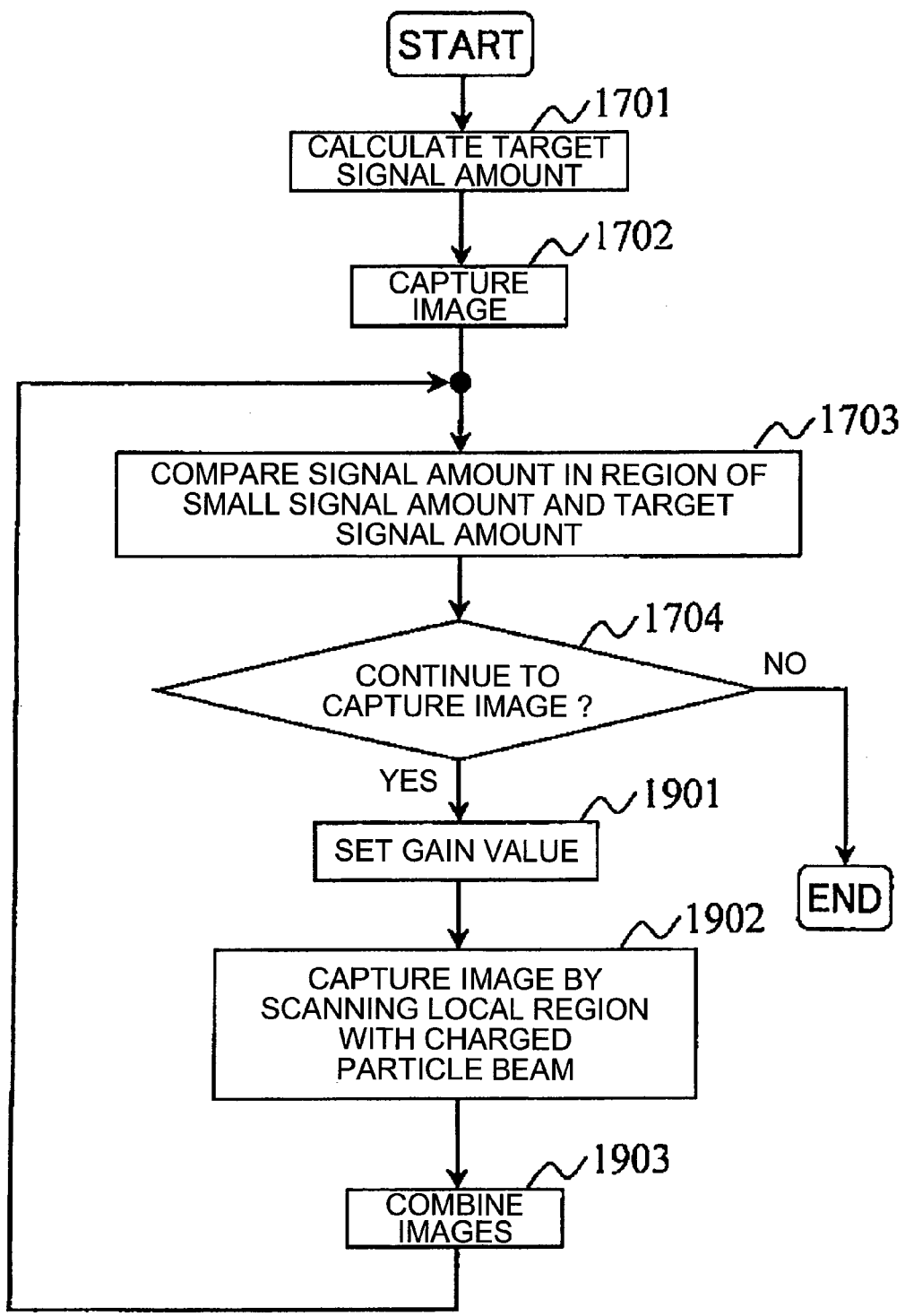
FIG. 19 is one example view of a sequence of capturing an image after varying a gain value, in the sequence of scanning a local region with a charged particle beam and capturing an image.

[Description of FIG. 19]

FIG. 19 is one example view of a sequence of varying a gain value and then capturing an image, in the sequence of capturing an image once based on a target signal amount and then scanning a local region with a charged particle beam and capturing an image. Steps 1701 to 1704 are the same as those in FIG. 17. If it is determined, in Step 1704, to continue to capture an image, then in Step 1901, a gain value is set, and subsequently, in Step 1902, a local region is scanned with a charged particle beam at the set gain value to capture an image. In Step 1903, the images captured so far and the image newly captured in Step 1902 are combined. In combining the images, the process of calculating a weight shown in FIG. 7 or the process of combining images using the weight shown in FIG. 8 can be applied. However, as described in FIG. 17, a weight is set to zero at a position that is not irradiated with a charged particle beam.

[Effect of FIG. 19]

With this sequence, an image in a dark part can be captured at an increased gain value, and the signal amount obtained from a dark part can be increased and also an image having less thermal noise and/or quantization noise can be obtained.

[Description of FIG. 20]

FIG. 20A and FIG. 20B show one example view of setting a local region to be scanned with a charged particle beam, in irradiating the local region with a charged particle beam and capturing an image in Step 1705 and Steps 1902. In FIG. 20A, on an image representing a region to be imaged of a sample, a region to be scanned with a charged particle beam is indicated by cross-hatching. Moreover, the scanning direction of a charged particle beam is indicated by an arrow on the image. The region to be scanned with a charged particle beam may be calculated using design data or may be calculated using an already captured image. An image 2001 is an example of scanning an underlayer region with a beam. A dark part can be extracted as a region where the lightness value of an image falls below a certain threshold value, for example, or can be also extracted by performing a post treatment, such enlargement or reduction, on a region where the lightness value of an image falls below a certain threshold value. An image 2002 is an example of irradiating a region slightly wider than the image 2001 with a charged particle beam, the region being obtained by enlarging an underlayer region to some extent. Taking into consideration the deformation of a sample occurring when the sample is scanned with a charged particle beam, the accuracy of the scanning position of a charged particle beam, and the like, it is often preferable to scan a region slightly larger than a region where information is desired to be obtained. An image 2003 is an example of scanning also a region of an upper layer pattern of a narrow width sandwiched by underlayer regions with a charged particle beam. When a specific local region is irradiated with a charged particle beam, a sample will be locally charged, and therefore a side effect might be caused, for example, such as that an image tends to blur. If the imaging time is sufficiently short even if the region of an upper layer pattern is scanned, even an upper layer pattern often had better be scanned as with this example. An image 2004 is an example of scanning a vertically elongated region 2011 and a laterally elongated region 2012 with a charged particle beam. The scanning direction of a charged particle beam may be varied, such as that the vertically elongated region 2011 is vertically scanned while the laterally elongated region 2012 is laterally scanned. An image 2005 is an example, in which a region to be scanned with a charged particle beam includes an obliquely elongated region 2013. In this case, the region may be obliquely scanned with a charged particle beam.

FIG. 20B shows an example of performing a total of three times of image capturing, i.e., performing the image capturing in Step 1702 once and the image capturing in Step 1705 or Step 1902 twice. On an image representing a region to be imaged of a sample, a region to be scanned with a charged particle beam in the second time image capturing is indicated by wavy-hatching. Moreover, a region to be scanned with a charged particle beam in the second and third time image capturing is indicated by cross-hatching. An image 2006 is an example including a hole pattern 2014 and an underlayer region, and is an example, in which although the hole pattern is a dark part, a large signal amount can be obtained as compared with the underlayer region. In the hole pattern, the hole pattern and the region in the vicinity thereof are scanned with a charged particle beam only in the second-time image capturing, while the underlayer region is set to the target for the second and third time image capturing. In this manner, for each region, the number of times of scanning with a charged particle beam can be also varied.

Figure 21:
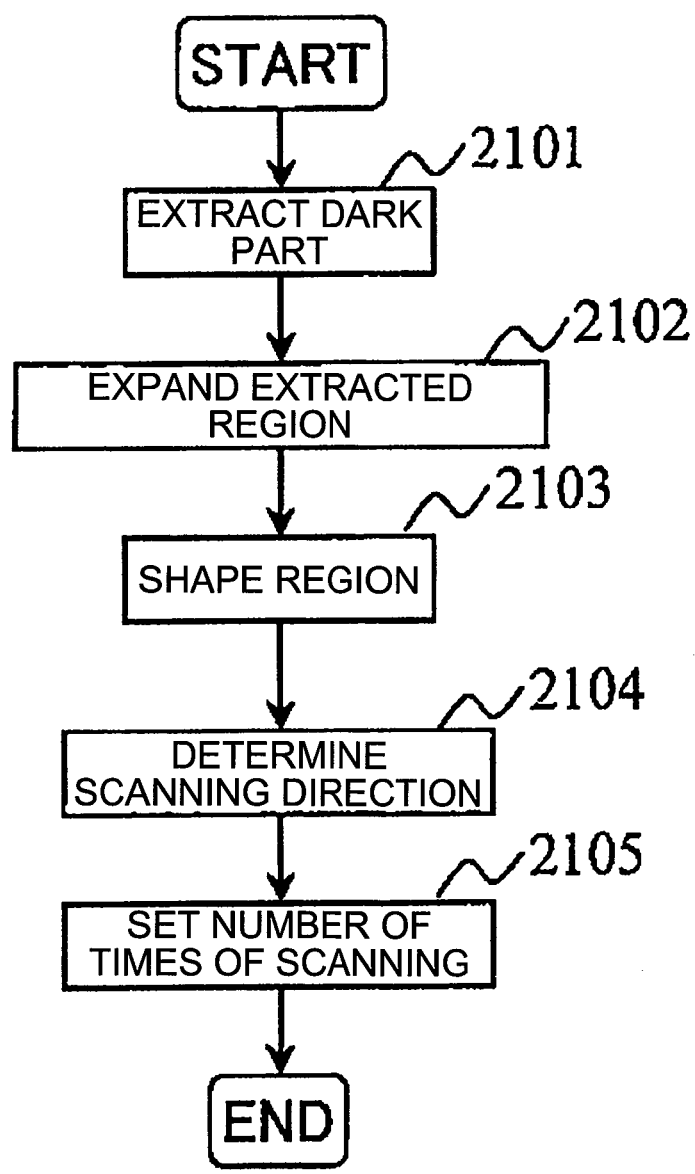
FIG. 21 is one example view of a sequence of calculating a local region that is scanned with a charged particle beam.

[Description of FIG. 21]

FIG. 21 is one example view of the sequence of calculating a local region scanned with a charged particle beam in Step 1705 and Step 1902. First, a dark part is extracted in Step 2101. Next, in Step 2102, the extracted region is expanded. With this step, a region wider than a dark part, as in the image 2002 or the image 2003, for example, can be set to a region to be scanned with a charged particle beam. Next, in Step 2103, the expanded region is shaped. In order to scan with a charged particle beam at high speed, a region to be scanned had better have a simple (to some extent) shape and therefore is shaped into a simple shape in this step. Subsequently, in Step 2104, the scanning direction is determined based on the shape of the region. Finally, in Step 2105, the number of times of scanning is determined. For the determination of the number of times of scanning in Step 2105, if "how many times of scanning may be performed with a charged particle beam?" can be accurately (to a certain extent) calculated in advance, the number of times of scanning is calculated in advance and then for example, in Step 1704, this number of times of scanning may be used as reference information in determining whether or not to continue to capture an image. On the other hand, if it is difficult to calculate "how many times of scanning may be performed with a charged particle beam?" in advance, a local region to be scanned with a charged particle beam may be calculated every time an image is captured, and in this case, Step 2105 may not be performed.

[Description of FIG. 22]

FIG. 22A is one example view of a sequence of varying the gain values for different regions, capturing a plurality of images at the varied gain values, and combining the captured images. Steps 1001 to 1007 are the same as those in FIG. 10. Prior to Step 1002 or Step 1003, move to the k-th imaging place in Step 2211. Thus, the first to k-th images are captured for different regions not for the same region on the sample. However, regions, which are different regions on the sample but have a similar pattern, are scanned. If an object to be imaged is a semiconductor pattern, a similar region can be easily scanned. This example is described using FIG. 22B. Usually, there are a plurality of chips (a square indicated by cross-hatching represents one chip) in one wafer 2201, and each chip comprises the same pattern. Then, if the same place (e.g., 2202, 2203, or 2204) in a different chip is scanned, a similar image can be obtained. Alternatively, in the case of a memory or the like, even the same chip includes a large number of repetitive patterns (e.g., 2205 or 2206). If design data is used, it is easy to search these similar regions, and as an alternative method, an image of a wide field of view may be captured and a similar region may be searched using this image. A similar region may be searched using an image captured by other device, such as an optical microscope.

[Effect of FIG. 22]

If the same region on a sample is captured, there are also side effects, such as that the sample is damaged depending on the quality of the material of the sample and that the sample is deformed. Then, in this manner, an image is captured for a region that is a different region but can provides a similar image, thereby allowing for image capturing while suppressing a damage on the same place of a sample.

In the foregoing, the present invention made by the present inventor has been specifically described based on the embodiment, but the present invention is not limited to the above-described embodiment and various modifications may be made without departing from the scope of the invention. According to the present invention, for a charged particle microscope image, the gain of a detector is set to different gain values to capture the respective images corresponding to the different gain values, and the captured images are combined using the gain values that were used in capturing the images, so that an excellent image quality can be obtained in the entire region including a dark part. Moreover, a local region including a dark part is irradiated with a charged particle beam until a sufficient signal amount is obtained from the dark part, so that a sufficient signal amount can be obtained from the dark part and a high quality image can be captured.

REFERENCE SIGNS LIST

101 . . . process of calculating first gain value, 102 . . . process of capturing first image, 103 . . . process of calculating second gain value, 104 . . . process of capturing second image, 105 . . . process of calculating weight of first image and weight of second image, 106 . . . process of combining first image and second image, 201 . . . beam irradiation/detection device, 202 . . . charged particle gun, 203 . . . charged particle beam, 204 . . . condensing lens, 205 . . . objective lens, 206 . . . sample, 207 . . . stage, 208 . . . detector, 221 . . . input/output unit, 222 . . . control unit, 223 . . . processing unit, 224 . . . storage unit, 225 . . . gain control unit, 226 . . . image combining unit

The invention claimed is:

1. A method for capturing an image of a sample using a charged particle microscope device, the method comprising:
   a target signal amount calculation step of calculating a target signal amount;
   an image capturing step of scanning the sample with a charged particle beam and capturing a first image of the sample;
   an image-capturing continuation determination step of comparing a signal amount in a region comprising a pixel of a relatively small signal amount in the first captured image and the calculated target signal amount, and determining whether or not to continue to capture an image; and
   an image-capturing continuation step of, when it is determined, in the image-capturing continuation determination step, to continue to capture an image, calculating a region of the sample to be scanned again, based on a position of a pixel of a relatively small signal amount in the first captured image, scanning the calculated region of the sample to be scanned again with a charged particle beam and capturing a second image, and combining the first image and the second image, wherein the image-capturing continuation determination step and the image-capturing continuation step are repeated until it is determined, in the image-capturing continuation determination step, not to continue to capture an image.

2. The image capturing method according to claim 1, wherein in the target signal amount calculation step, the target signal amount is calculated based on a request value of S/N or a request value of a signal amount that is specified prior to capturing an image.

3. The image capturing method according to claim 1, wherein in the image-capturing continuation determination step, it is determined whether or not to continue to capture an image, based on an upper limit and a lower limit of a imaging time that are defined prior to capturing an image.

4. The image capturing method according to claim 1, wherein in the image-capturing continuation step, a gain of a detector is set to a gain value different from the gain of the detector used in the image capturing step, and the second image is captured.

5. A charged particle microscope device comprising:
a charged-particle irradiation optical system unit configured to irradiates a sample with a charged particle;
a particle detection optical system unit configured to detect a same type or different type particle generated from the sample that is irradiated with a charged particle by the charged-particle irradiation optical system unit; and
a captured-image acquisition unit configured to process a signal detected by the particle detection optical system unit and obtain a captured image of the sample, the charged particle microscope device further comprising:
a target signal amount calculation unit configured to calculate a target signal amount;
a determination unit configured to compare a signal amount in a region comprising a pixel of a relatively small signal amount in a first image captured by scanning the sample with the charged particle and a target signal amount calculated by the target signal amount calculation unit and determine whether or not to continue to capture an image; and
an image combining unit configured to, when it is determined by the determination unit to continue to capture an image, calculate a region of the sample to be scanned again based on a position of a pixel of a relatively small signal amount in the first image, capture a second image by scanning the calculated region of the sample with a charged particle, combine the first image and the second image, and repeat the capturing of the image and the combining of the images until it is determined by the determination unit not to continue to capture an image.

6. The electric charge electron microscope device according to claim 5, wherein the target signal calculation unit calculates the target signal amount based on a request value of S/N or a request value of a signal amount, the request value being specified in advance.

7. The charged particle microscope device according to claim 5, wherein the determination unit determines whether or not to continue to capture an image based on a predetermined upper limit and lower limit of an imaging time.

8. The charged particle microscope device according to claim 5, further comprising a gain control unit configured to adjust a gain of a detector of the particle detection optical system unit.

* * * * *